United States Patent
Lear et al.

(10) Patent No.: US 12,431,457 B2
(45) Date of Patent: Sep. 30, 2025

(54) ELECTROMAGNETIC SHIELDS WITH BONDING WIRES FOR SUB-MODULES

(71) Applicant: Qorvo US, Inc., Greensboro, NC (US)

(72) Inventors: Kelly M. Lear, Longwood, FL (US); Jeffrey Miller, Allen, TX (US); Joseph Edward Geniac, Greensboro, NC (US); Rommel Quintero, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 196 days.

(21) Appl. No.: 18/046,756

(22) Filed: Oct. 14, 2022

(65) Prior Publication Data

US 2023/0075555 A1    Mar. 9, 2023

Related U.S. Application Data

(63) Continuation of application No. 16/417,815, filed on May 21, 2019, now Pat. No. 11,515,282.

(51) Int. Cl.
  *H01L 23/00*    (2006.01)
  *H01L 23/31*    (2006.01)
  (Continued)

(52) U.S. Cl.
  CPC .......... *H01L 24/49* (2013.01); *H01L 23/3107* (2013.01); *H01L 24/97* (2013.01);
  (Continued)

(58) Field of Classification Search
  CPC ..... H01L 24/49; H01L 24/97; H01L 23/3107; H01L 2924/3025
  See application file for complete search history.

(56) References Cited

U.S. PATENT DOCUMENTS

| | | |
|---|---|---|
| 3,566,190 A | 2/1971 | Huebner et al. |
| 3,907,616 A | 9/1975 | Wiemer |

(Continued)

FOREIGN PATENT DOCUMENTS

| | | |
|---|---|---|
| CN | 1855451 A | 11/2006 |
| CN | 1957468 A | 5/2007 |

(Continued)

OTHER PUBLICATIONS

First Office Action for Chinese Patent Application No. 201980088979.3, mailed Nov. 10, 2023, 23 pages.

(Continued)

*Primary Examiner* — William B Partridge
*Assistant Examiner* — Gustavo G Ramallo
(74) *Attorney, Agent, or Firm* — Withrow & Terranova, P.L.L.C.

(57) ABSTRACT

Electromagnetic shields for electronic devices, and particularly electromagnetic shields with bonding wires for sub-modules of electronic devices are disclosed. Electronic modules are disclosed that include multiple sub-modules arranged on a substrate with an electromagnetic shield arranged on or over the sub-modules. Bonding wires are disclosed that form one or more bonding wire walls along the substrate. The one or more bonding wire walls may be located between sub-modules of a module and about peripheral boundaries of the module. The electromagnetic shield may be electrically coupled to ground by way of the one or more bonding wire walls. Portions of the electromagnetic shield and the one or more bonding wire walls may form divider walls that are configured to reduce electromagnetic interference between the sub-modules or from external sources.

20 Claims, 9 Drawing Sheets

(51) Int. Cl.
*H05K 1/02* (2006.01)
*H05K 1/14* (2006.01)
*H05K 3/40* (2006.01)

(52) U.S. Cl.
CPC ........... *H05K 1/0218* (2013.01); *H05K 1/144* (2013.01); *H05K 3/4007* (2013.01); *H01L 2224/04042* (2013.01); *H01L 2224/48091* (2013.01); *H01L 2224/48229* (2013.01); *H01L 2924/14* (2013.01); *H01L 2924/1532* (2013.01); *H01L 2924/3025* (2013.01); *H05K 2201/10371* (2013.01)

(56) References Cited

U.S. PATENT DOCUMENTS

| | | | |
|---|---|---|---|
| 3,907,617 | A | 9/1975 | Zwernemann |
| 4,680,676 | A | 7/1987 | Petratos et al. |
| 5,329,695 | A | 7/1994 | Traskos et al. |
| 5,389,738 | A | 2/1995 | Piosenka et al. |
| 5,406,630 | A | 4/1995 | Piosenka et al. |
| 5,436,203 | A | 7/1995 | Lin |
| 5,459,368 | A | 10/1995 | Onishi et al. |
| 5,473,512 | A | 12/1995 | Degani et al. |
| 5,592,391 | A | 1/1997 | Muyshondt et al. |
| 5,623,293 | A | 4/1997 | Aoki |
| 5,639,989 | A | 6/1997 | Higgins, III |
| 5,646,828 | A | 7/1997 | Degani et al. |
| 5,650,659 | A | 7/1997 | Mostafazadeh et al. |
| 5,870,289 | A | 2/1999 | Tokuda et al. |
| 5,977,626 | A | 11/1999 | Wang et al. |
| 6,004,180 | A | 12/1999 | Knall et al. |
| 6,011,698 | A | 1/2000 | Buehler |
| 6,137,693 | A | 10/2000 | Schwiebert et al. |
| 6,150,193 | A | 11/2000 | Glenn |
| 6,163,454 | A | 12/2000 | Strickler |
| 6,219,243 | B1 | 4/2001 | Ma et al. |
| 6,297,957 | B1 | 10/2001 | Johnson et al. |
| 6,429,386 | B2 | 8/2002 | DiBene, II et al. |
| 6,448,583 | B1 | 9/2002 | Yoneda et al. |
| 6,448,793 | B1 | 9/2002 | Barratt et al. |
| 6,466,416 | B1 | 10/2002 | Honjo et al. |
| 6,515,870 | B1 | 2/2003 | Skinner et al. |
| 6,534,859 | B1 | 3/2003 | Shim et al. |
| 6,538,196 | B1 | 3/2003 | MacDonald et al. |
| 6,590,152 | B1 | 7/2003 | Horio et al. |
| 6,599,779 | B2 | 7/2003 | Shim et al. |
| 6,613,660 | B2 | 9/2003 | Kahlert et al. |
| 6,633,073 | B2 | 10/2003 | Rezvani et al. |
| 6,657,592 | B2 | 12/2003 | Dening et al. |
| 6,707,168 | B1 | 3/2004 | Hoffman et al. |
| 6,717,485 | B2 | 4/2004 | Kolb et al. |
| 6,791,795 | B2 | 9/2004 | Ohtomo et al. |
| 6,807,731 | B2 | 10/2004 | Brandenburg et al. |
| 6,825,560 | B1 | 11/2004 | Walker et al. |
| 6,838,750 | B2 | 1/2005 | Nuytkens et al. |
| 6,887,787 | B2 | 5/2005 | Farnworth |
| 6,894,229 | B1 | 5/2005 | Cheah |
| 6,900,383 | B2 | 5/2005 | Babb et al. |
| 6,946,324 | B1 | 9/2005 | McLellan et al. |
| 6,947,295 | B2 | 9/2005 | Hsieh |
| 6,998,532 | B2 | 2/2006 | Kawamoto et al. |
| 7,030,469 | B2 | 4/2006 | Mahadevan et al. |
| 7,042,398 | B2 | 5/2006 | Tang et al. |
| 7,087,461 | B2 | 8/2006 | Park et al. |
| 7,087,462 | B1 | 8/2006 | Park et al. |
| 7,109,410 | B2 | 9/2006 | Arnold et al. |
| 7,109,817 | B2 | 9/2006 | Kolb et al. |
| 7,125,744 | B2 | 10/2006 | Takehara et al. |
| 7,148,574 | B2 | 12/2006 | Lee et al. |
| 7,187,060 | B2 | 3/2007 | Usui |
| 7,227,719 | B2 | 6/2007 | Sasaki et al. |
| 7,259,041 | B2 | 8/2007 | Stelzl et al. |
| 7,330,084 | B2 | 2/2008 | Lee et al. |
| 7,342,303 | B1 | 3/2008 | Berry et al. |
| 7,348,663 | B1 | 3/2008 | Kirloskar et al. |
| 7,433,203 | B1 | 10/2008 | Yi et al. |
| 7,443,693 | B2 | 10/2008 | Arnold et al. |
| 7,445,968 | B2 | 11/2008 | Harrison et al. |
| 7,451,539 | B2 | 11/2008 | Morris et al. |
| 7,478,474 | B2 | 1/2009 | Koga |
| 7,488,903 | B2 | 2/2009 | Kawagishi et al. |
| 7,514,772 | B2 | 4/2009 | Kobayashi et al. |
| 7,548,430 | B1 | 6/2009 | Huemoeller et al. |
| 7,598,606 | B2 | 10/2009 | Chow et al. |
| 7,633,170 | B2 | 12/2009 | Yang et al. |
| 7,633,765 | B1 | 12/2009 | Scanlan et al. |
| 7,635,918 | B2 | 12/2009 | Yoshida |
| 7,636,245 | B2 | 12/2009 | Clancy et al. |
| 7,643,311 | B2 | 1/2010 | Coffy |
| 7,651,889 | B2 | 1/2010 | Tang et al. |
| 7,665,201 | B2 | 2/2010 | Sjoedin |
| 7,671,451 | B2 | 3/2010 | Lee et al. |
| 7,700,411 | B2 | 4/2010 | Yang et al. |
| 7,701,728 | B2 | 4/2010 | Hatanaka et al. |
| 7,745,910 | B1 | 6/2010 | Olson et al. |
| 7,772,046 | B2 | 8/2010 | Pagaila et al. |
| 7,829,981 | B2 | 11/2010 | Hsu |
| 7,902,643 | B2 | 3/2011 | Tuttle |
| 7,902,644 | B2 | 3/2011 | Huang et al. |
| 7,928,538 | B2 | 4/2011 | Salzman |
| 7,989,928 | B2 | 8/2011 | Liao et al. |
| 8,013,258 | B2 | 9/2011 | Wu |
| 8,053,872 | B1 | 11/2011 | Swan et al. |
| 8,061,012 | B2 | 11/2011 | Carey et al. |
| 8,062,930 | B1 | 11/2011 | Shah et al. |
| 8,071,431 | B2 | 12/2011 | Hoang et al. |
| 8,084,300 | B1 | 12/2011 | San Antonio et al. |
| 8,093,690 | B2 | 1/2012 | Ko et al. |
| 8,093,691 | B1 | 1/2012 | Fuentes et al. |
| 8,110,441 | B2 | 2/2012 | Chandra et al. |
| 8,186,048 | B2 | 5/2012 | Leahy et al. |
| 8,220,145 | B2 | 7/2012 | Hiner et al. |
| 8,268,677 | B1 | 9/2012 | Pagaila |
| 8,296,938 | B2 | 10/2012 | Carey et al. |
| 8,296,941 | B2 | 10/2012 | Hiner et al. |
| 8,349,659 | B1 | 1/2013 | Swan et al. |
| 8,359,739 | B2 | 1/2013 | Carey et al. |
| 8,373,264 | B2 | 2/2013 | Welch et al. |
| 8,409,658 | B2 | 4/2013 | Hiner et al. |
| 8,410,584 | B2 | 4/2013 | An et al. |
| 8,434,220 | B2 | 5/2013 | Rao et al. |
| 8,507,319 | B2 | 8/2013 | Chow et al. |
| 8,552,539 | B1 | 10/2013 | Foster |
| 8,614,899 | B2 | 12/2013 | Madsen et al. |
| 8,664,774 | B1 | 3/2014 | Mosinskis |
| 8,720,051 | B2 | 5/2014 | Leahy et al. |
| 8,748,230 | B2 | 6/2014 | Welch et al. |
| 8,835,226 | B2 | 9/2014 | Morris et al. |
| 8,861,221 | B2 | 10/2014 | Pagaila |
| 8,959,762 | B2 | 2/2015 | Leahy et al. |
| 8,987,889 | B2 | 3/2015 | Welch et al. |
| 9,048,020 | B2 | 6/2015 | Calvillo Cortes et al. |
| 9,137,934 | B2 | 9/2015 | Morris et al. |
| 9,450,547 | B2 | 9/2016 | Szymanowski et al. |
| 9,589,927 | B2 | 3/2017 | Szymanowski et al. |
| 9,627,230 | B2 | 4/2017 | Carey et al. |
| 9,661,739 | B2 | 5/2017 | Leahy et al. |
| 9,935,075 | B2 | 4/2018 | Huang et al. |
| 9,978,691 | B2 | 5/2018 | Kuo et al. |
| 11,830,845 | B2 * | 11/2023 | Sato ........................ H01L 25/16 |
| 2002/0036325 | A1 | 3/2002 | Iseki et al. |
| 2002/0118529 | A1 | 8/2002 | Babin et al. |
| 2002/0142516 | A1 | 10/2002 | Light |
| 2003/0011049 | A1 | 1/2003 | Nuytkens et al. |
| 2003/0048581 | A1 | 3/2003 | Ohtomo et al. |
| 2003/0062541 | A1 | 4/2003 | Warner |
| 2003/0090883 | A1 | 5/2003 | Asahi et al. |
| 2003/0151122 | A1 | 8/2003 | Davies |
| 2004/0063246 | A1 | 4/2004 | Karnezos |
| 2004/0103509 | A1 | 6/2004 | Bidard et al. |
| 2004/0104473 | A1 | 6/2004 | Farnworth |
| 2004/0178500 | A1 | 9/2004 | Usui |
| 2004/0209434 | A1 | 10/2004 | Seaford et al. |

(56) References Cited

U.S. PATENT DOCUMENTS

| | | |
|---|---|---|
| 2004/0214023 A1 | 10/2004 | Park et al. |
| 2004/0222511 A1 | 11/2004 | Zhang |
| 2004/0232536 A1 | 11/2004 | Fukuzumi |
| 2004/0238857 A1 | 12/2004 | Beroz et al. |
| 2004/0238934 A1 | 12/2004 | Warner et al. |
| 2005/0046001 A1 | 3/2005 | Warner |
| 2005/0153061 A1 | 7/2005 | Nuytkens et al. |
| 2006/0033184 A1 | 2/2006 | Park et al. |
| 2006/0113642 A1 | 6/2006 | Kajiki et al. |
| 2006/0119448 A1 | 6/2006 | Lee et al. |
| 2006/0151203 A1 | 7/2006 | Krueger et al. |
| 2006/0223577 A1 | 10/2006 | Ouzillou |
| 2006/0244131 A1 | 11/2006 | Kobayashi et al. |
| 2006/0266547 A1 | 11/2006 | Koga |
| 2006/0273467 A1 | 12/2006 | Brandenburg et al. |
| 2006/0273813 A1 | 12/2006 | Coffy |
| 2006/0274517 A1 | 12/2006 | Coffy |
| 2007/0030661 A1 | 2/2007 | Morris et al. |
| 2007/0042593 A1 | 2/2007 | Lee et al. |
| 2007/0045248 A1 | 3/2007 | Schein et al. |
| 2007/0058748 A1 | 3/2007 | Kim et al. |
| 2007/0062637 A1 | 3/2007 | Sjoedin |
| 2007/0120250 A1 | 5/2007 | Fairchild et al. |
| 2007/0155053 A1 | 7/2007 | Karnezos |
| 2007/0163802 A1 | 7/2007 | Monthei |
| 2007/0200210 A1 | 8/2007 | Zhao et al. |
| 2007/0221399 A1 | 9/2007 | Nishizawa et al. |
| 2007/0222697 A1 | 9/2007 | Caimi et al. |
| 2007/0290322 A1 | 12/2007 | Zhao et al. |
| 2008/0019112 A1 | 1/2008 | Hatanaka et al. |
| 2008/0054421 A1 | 3/2008 | Dimaano et al. |
| 2008/0067645 A1 | 3/2008 | Foong et al. |
| 2008/0108179 A1 | 5/2008 | Mistry et al. |
| 2008/0112151 A1 | 5/2008 | Thompson et al. |
| 2008/0139013 A1 | 6/2008 | Tomura et al. |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0009979 A1 | 1/2009 | Mori et al. |
| 2009/0016039 A1 | 1/2009 | Imamura |
| 2009/0025211 A1 | 1/2009 | Hiner et al. |
| 2009/0051011 A1 | 2/2009 | Usami |
| 2009/0066588 A1 | 3/2009 | Cheng et al. |
| 2009/0067149 A1 | 3/2009 | Bogursky et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1 | 2/2010 | An et al. |
| 2010/0051343 A1 | 3/2010 | Lam |
| 2010/0052125 A1 | 3/2010 | Sasaki et al. |
| 2010/0123233 A1 | 5/2010 | Yoon et al. |
| 2010/0199492 A1 | 8/2010 | Hiner et al. |
| 2010/0207258 A1 | 8/2010 | Eun et al. |
| 2010/0224992 A1 | 9/2010 | McConnelee et al. |
| 2010/0279730 A1 | 11/2010 | Ortiz |
| 2011/0003435 A1 | 1/2011 | Tang et al. |
| 2011/0014880 A1 | 1/2011 | Nicolson et al. |
| 2011/0017263 A1 | 1/2011 | Gibson et al. |
| 2011/0038136 A1 | 2/2011 | Carey et al. |
| 2011/0084368 A1 | 4/2011 | Hoang et al. |
| 2011/0084378 A1 | 4/2011 | Welch et al. |
| 2011/0085314 A1 | 4/2011 | Franz |
| 2011/0114369 A1 | 5/2011 | Lee et al. |
| 2011/0182048 A1 | 7/2011 | Roethlingshoefer et al. |
| 2011/0225803 A1 | 9/2011 | Hiner et al. |
| 2011/0227209 A1 | 9/2011 | Yoon et al. |
| 2011/0235282 A1 | 9/2011 | Leahy et al. |
| 2011/0298109 A1 | 12/2011 | Pagaila et al. |
| 2011/0298110 A1 | 12/2011 | Pagaila et al. |
| 2011/0298670 A1 | 12/2011 | Jung et al. |
| 2011/0316657 A1 | 12/2011 | Park et al. |
| 2012/0002377 A1 | 1/2012 | French et al. |
| 2012/0025356 A1* | 2/2012 | Liao ............... H01L 24/97 257/659 |
| 2012/0044653 A1 | 2/2012 | Morris et al. |
| 2012/0074538 A1 | 3/2012 | Tsai et al. |
| 2012/0075821 A1 | 3/2012 | Pagaila |
| 2012/0126378 A1 | 5/2012 | San Antonio et al. |
| 2012/0139640 A1 | 6/2012 | Calvillo Cortes et al. |
| 2012/0182706 A1 | 7/2012 | Siomkos et al. |
| 2012/0217048 A1 | 8/2012 | Leahy et al. |
| 2012/0217624 A1 | 8/2012 | Morris et al. |
| 2012/0218729 A1 | 8/2012 | Carey et al. |
| 2012/0270371 A1 | 10/2012 | DeBar et al. |
| 2012/0286415 A1 | 11/2012 | Sakai et al. |
| 2013/0324069 A1 | 12/2013 | Chen et al. |
| 2014/0062607 A1* | 3/2014 | Nair ............... H01L 23/5389 361/679.02 |
| 2014/0077349 A1 | 3/2014 | Higgins, III |
| 2014/0097007 A1 | 4/2014 | Nagai et al. |
| 2014/0182920 A1 | 7/2014 | Yanagisawa et al. |
| 2014/0262442 A1 | 9/2014 | Nomura et al. |
| 2014/0268587 A1 | 9/2014 | Nomura et al. |
| 2014/0307394 A1 | 10/2014 | Lobianco et al. |
| 2014/0340859 A1 | 11/2014 | Morris et al. |
| 2014/0353807 A1 | 12/2014 | Welch |
| 2014/0355222 A1 | 12/2014 | Dang et al. |
| 2015/0091157 A9 | 4/2015 | Chi et al. |
| 2015/0124421 A1 | 5/2015 | Leahy et al. |
| 2015/0170986 A1 | 6/2015 | Szymanowski et al. |
| 2015/0296631 A1 | 10/2015 | Morris et al. |
| 2015/0348936 A1 | 12/2015 | Lin et al. |
| 2016/0087588 A1 | 3/2016 | Szymanowski et al. |
| 2016/0148882 A1 | 5/2016 | Kim et al. |
| 2016/0211222 A1 | 7/2016 | Kuo et al. |
| 2017/0117230 A1 | 4/2017 | Kumbhat et al. |
| 2017/0118877 A1 | 4/2017 | Kumbhat et al. |
| 2017/0127581 A1 | 5/2017 | Figueredo et al. |
| 2017/0133326 A1 | 5/2017 | Dang et al. |
| 2017/0194281 A1 | 7/2017 | DeLaCruz et al. |
| 2018/0033764 A1 | 2/2018 | Huang et al. |
| 2018/0130755 A1* | 5/2018 | Lee ............... H01L 25/0655 |
| 2019/0371738 A1 | 12/2019 | Morris et al. |
| 2020/0008327 A1 | 1/2020 | Lear et al. |
| 2020/0203248 A1 | 6/2020 | Nair et al. |

FOREIGN PATENT DOCUMENTS

| | | |
|---|---|---|
| CN | 104112716 A | 10/2014 |
| EP | 1458023 A2 | 9/2004 |
| EP | 1715520 B1 | 10/2006 |
| EP | 1717857 A2 | 11/2006 |
| EP | 1764834 B1 | 3/2009 |
| JP | H11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |
| JP | 2011523120 A | 8/2011 |
| JP | 5254446 B2 | 8/2013 |
| KR | 20060113412 A | 11/2006 |
| TW | 201108360 A | 3/2011 |
| TW | 201142965 A | 12/2011 |
| TW | 201434129 A | 9/2014 |
| WO | 0035085 A1 | 6/2000 |
| WO | 03058812 A1 | 7/2003 |
| WO | 2004019490 A1 | 3/2004 |

(56) References Cited

FOREIGN PATENT DOCUMENTS

| WO | 2004060034 A1 | 7/2004 |
|---|---|---|
| WO | 2007060784 A1 | 5/2007 |
| WO | 2007132560 A1 | 11/2007 |
| WO | 2009099699 A2 | 8/2009 |
| WO | 2009144960 A1 | 12/2009 |
| WO | 2010014103 A1 | 2/2010 |
| WO | 2010021262 A1 | 2/2010 |
| WO | 2017091152 A1 | 6/2017 |

OTHER PUBLICATIONS

Extended European Search Report for European Patent Application No. 23181904.6, mailed Oct. 19, 2023, 9 pages.
Notice of Allowance for U.S. Appl. No. 11/952,690, mailed Aug. 30, 2010, 9 pages.
Non-Final Office Action for U.S. Appl. No. 11/952,690, mailed Mar. 25, 2010, 9 pages.
Non-Final Rejection for U.S. Appl. No. 12/913,364, mailed Feb. 13, 2012, 6 pages.
Notice of Allowance for U.S. Appl. No. 12/913,364, mailed Jun. 8, 2012, 8 pages.
Non-Final Office Action for U.S. Appl. No. 13/189,838, mailed Mar. 14, 2014, 14 pages.
Final Office Action for U.S. Appl. No. 13/189,838, mailed Jun. 19, 2014, 10 pages.
Advisory Action for U.S. Appl. No. 13/189,838, mailed Aug. 28, 2014, 2 pages.
Non-Final Office Action for U.S. Appl. No. 13/189,838, mailed Oct. 28, 2014, 11 pages.
Final Office Action for U.S. Appl. No. 13/189,838, mailed Feb. 20, 2015, 13 pages.
Non-Final Office Action for U.S. Appl. No. 13/034,755, mailed Aug. 15, 2013, 6 pages.
Final Office Action for U.S. Appl. No. 13/034,755, mailed Jan. 31, 2014, 10 pages.
Advisory Action for U.S. Appl. No. 13/034,755, mailed Mar. 4, 2014, 3 pages.
Notice of Allowance for U.S. Appl. No. 13/034,755, mailed Oct. 17, 2014, 7 pages.
Non-Final Office Action for U.S. Appl. No. 13/034,787, mailed Jan. 16, 2013, 9 pages.
Final Office Action for U.S. Appl. No. 13/034,787, mailed Mar. 19, 2013, 9 pages.
Advisory Action for U.S. Appl. No. 13/034,787, mailed May 17, 2013, 3 pages.
Non-Final Office Action for U.S. Appl. No. 13/034,787, mailed Aug. 9, 2013, 9 pages.
Final Office Action for U.S. Appl. No. 13/034,787, mailed Nov. 15, 2013, 12 pages.
Advisory Action for U.S. Appl. No. 13/034,787, mailed Jan. 27, 2014, 4 pages.
Advisory Action for U.S. Appl. No. 13/034,787, mailed Feb. 26, 2014, 4 pages.
Notice of Allowance for U.S. Appl. No. 13/034,787, mailed May 1, 2014, 9 pages.
Corrected Notice of Allowability for U.S. Appl. No. 13/034,787, mailed Jul. 29, 2014, 5 pages.
Non-Final Office Action for U.S. Appl. No. 12/797,381, mailed Jan. 8, 2013, 20 pages.
Final Office Action for U.S. Appl. No. 12/797,381, mailed May 16, 2013, 19 pages.
Advisory Action for U.S. Appl. No. 12/797,381, mailed Jul. 17, 2013, 3 pages.
Examiner's Answer for U.S. Appl. No. 12/797,381, mailed Dec. 31, 2013, 6 pages.
Final Office Action for U.S. Appl. No. 13/036,272, mailed Oct. 20, 2014, 6 pages.
Advisory Action for U.S. Appl. No. 13/036,272, mailed Jan. 8, 2015, 3 pages.

Author Unknown, "Cho-Shield Conductive Coatings," Chomerics—EMI Products, Copyright: 2001, 1 page, Retrieved from http://www.chomerics.com/products/choshield_coatings.htm.
Author Unknown, "Cho-Shield Conductive Coatings," Chomerics: a Division of Parker Hannifin Corporation, Dec. 8, 2000, 3 pages, Retrieved from: http://www.chomerics.com/products/choshield_coatings.htm.
Author Unknown, "Fractional-N RF Synthesizer with Modulator and Digital IF Filter (RF6001)," RF Micro Devices: Part of the Polaris Total Radio Solution, 2005, 2 pages.
Notice of Allowance for U.S. Appl. No. 13/189,838, mailed May 4, 2015, 8 pages.
Notice of Allowance for U.S. Appl. No. 13/189,838, mailed Jul. 30, 2015, 5 pages.
Non-Final Office Action for U.S. Appl. No. 13/036,272, mailed Apr. 14, 2015, 7 pages.
Non-Final Office Action for U.S. Appl. No. 14/447,847, mailed May 7, 2015, 7 pages.
Final Office Action for U.S. Appl. No. 14/447,847, mailed Sep. 14, 2015, 8 pages.
Non-Final Office Action for U.S. Appl. No. 13/906,892, mailed Aug. 10, 2015, 10 pages.
International Preliminary Report on Patentability and Written Opinion for International Patent Application No. PCT/US2008/068153, mailed Jan. 5, 2010, 6 pages.
Non-Final Office Action for U.S. Appl. No. 14/595,401, mailed Mar. 28, 2016, 14 pages.
Examination Report for Indian Patent Application No. 8469/DELNP/2009, mailed Apr. 11, 2017, 7 pages.
Final Office Action for U.S. Appl. No. 14/595,401, mailed Oct. 6, 2016, 15 pages.
Notice of Allowance for U.S. Appl. No. 14/595,401, mailed Jan. 6, 2017, 8 pages.
Non-Final Office Action for U.S. Appl. No. 14/750,384, mailed Aug. 10, 2017, 9 pages.
Notice of Allowance for U.S. Appl. No. 14/750,384, mailed Nov. 22, 2017, 8 pages.
Decision on Appeal for U.S. Appl. No. 12/797,381, mailed Mar. 11, 2016, 6 pages.
Final Office Action for U.S. Appl. No. 13/036,272, mailed Nov. 19, 2015, 9 pages.
Advisory Action for U.S. Appl. No. 13/036,272, mailed Feb. 5, 2016, 3 pages.
Non-Final Office Action for U.S. Appl. No. 13/036,272, mailed Apr. 8, 2016, 7 pages.
Notice of Allowance for U.S. Appl. No. 13/036,272, mailed Sep. 30, 2016, 5 pages.
Final Office Action for U.S. Appl. No. 14/447,847, mailed Dec. 11, 2015, 8 pages.
Notice of Allowance for U.S. Appl. No. 11/199,319, mailed Oct. 2, 2008, 6 pages.
Non-Final Office Action for U.S. Appl. No. 11/435,913, mailed May 21, 2010, 5 pages.
Final Office Action for U.S. Appl. No. 11/435,913, mailed Nov. 17, 2009, 8 pages.
Non-Final Office Action for U.S. Appl. No. 11/435,913, mailed Mar. 2, 2009, 8 pages.
Final Office Action for U.S. Appl. No. 11/435,913, mailed Aug. 15, 2008, 8 pages.
Non-Final Office Action for U.S. Appl. No. 11/435,913, mailed Jan. 7, 2008, 7 pages.
Non-Final Office Action for U.S. Appl. No. 11/768,014, mailed Jan. 21, 2009, 9 pages.
Non-Final Office for U.S. Appl. No. 11/768,014, mailed Mar. 25, 2010, 9 pages.
Non-Final Office for U.S. Appl. No. 11/768,014, mailed Jul. 10, 2009, 7 pages.
Notice of Allowance for U.S. Appl. No. 13/187,814, mailed Sep. 10, 2012, 8 pages.
Non-Final Office Action for U.S. Appl. No. 11/952,484, mailed Jan. 8, 2010, 17 pages.
Final Office Action for U.S. Appl. No. 11/952,484, mailed Oct. 5, 2010, 19 pages.

(56) References Cited

OTHER PUBLICATIONS

Non-Final Office Action for U.S. Appl. No. 11/952,484, mailed Oct. 27, 2011, 22 pages.
Non-Final Office Action for U.S. Appl. No. 13/415,643, mailed Jan. 3, 2013, 17 pages.
Quayle Action for U.S. Appl. No. 13/415,643, mailed Jul. 11, 2013, 6 pages.
Notice of Allowance for U.S. Appl. No. 13/415,643, mailed Aug. 15, 2013, 8 pages.
Non-Final Office Action for U.S. Appl. No. 11/952,513, mailed May 10, 2011, 19 pages.
Final Office Action for U.S. Appl. No. 11/952,513, mailed Oct. 26, 2011, 16 pages.
Notice of Allowance for U.S. Appl. No. 11/952,513, mailed Mar. 6, 2012, 9 pages.
Non-Final Office Action for U.S. Appl. No. 13/117,284, mailed Nov. 9, 2011, 12 pages.
Final Office Action for U.S. Appl. No. 13/117,284, mailed Feb. 29, 2012, 8 pages.
Notice of Allowance for U.S. Appl. No. 13/117,284, mailed May 1, 2012, 8 pages.
Non-Final Office Action for U.S. Appl. No. 11/952,545, mailed Oct. 23, 2009, 12 pages.
Non-Final Office Action for U.S. Appl. No. 12/766,347, mailed Jun. 29, 2012, 11 pages.
Notice of Allowance for U.S. Appl. No. 11/952,592, mailed Aug. 6, 2012, 7 pages.
Non-Final Office Action for U.S. Appl. No. 11/952,592, mailed Sep. 19, 2011, 9 pages.
Final Office Action for U.S. Appl. No. 11/952,592, mailed Feb. 24, 2011, 9 pages.
Non-Final Office Action for U.S. Appl. No. 11/952,592, mailed Dec. 15, 2010, 9 pages.
Non-Final Office Action for U.S. Appl. No. 11/952,592, mailed Jul. 28, 2009, 7 pages.
Final Office Action for U.S. Appl. No. 11/952,592, mailed Apr. 16, 2010, 8 pages.
Final Office Action for U.S. Appl. No. 11/952,592, mailed Jan. 18, 2012, 10 pages.
Non-Final Office Action for U.S. Appl. No. 11/952,592, mailed Jun. 12, 2012, 10 pages.
Notice of Allowance for U.S. Appl. No. 11/952,617, mailed Jan. 8, 2013, 8 pages.
Notice of Allowance for U.S. Appl. No. 11/952,617, mailed Jun. 4, 2012, 9 pages.
Final Office Action for U.S. Appl. No. 11/952,617, mailed Feb. 16, 2012, 7 pages.
Non-Final Office Action for U.S. Appl. No. 11/952,617, mailed Jul. 28, 2011, 9 pages.
Non-Final Office Action for U.S. Appl. No. 11/952,617, mailed Sep. 26, 2008, 10 pages.
Final Office Action for U.S. Appl. No. 11/952,617, mailed Nov. 20, 2009, 16 pages.
Non-Final Office Action for U.S. Appl. No. 11/952,634, mailed Jun. 13, 2011, 7 pages.
Final Office Action for U.S. Appl. No. 11/952,634, mailed Feb. 1, 2011, 7 pages.
Final Office Action for U.S. Appl. No. 11/952,634, mailed Dec. 23, 2010, 8 pages.
Non-Final Office Action for U.S. Appl. No. 11/952,634, mailed Jul. 21, 2010, 7 pages.
Notice of Allowance for U.S. Appl. No. 13/151,499, mailed Dec. 19, 2013, 8 pages.
International Search Report for PCT/US2008/068153, mailed Dec. 9, 2008, 3 pages.
Office Action for Chinese Patent Application No. 200880104171.1, mailed Jun. 2, 2011, 20 pages.
Second Office Action for Chinese Patent Application No. 200880104171.1, mailed Feb. 16, 2012, 8 pages.
Non-Final Office Action for U.S. Appl. No. 11/952,670, mailed Jun. 22, 2011, 4 pages.
Non-Final Office Action for U.S. Appl. No. 11/952,670, mailed May 27, 2010, 6 pages.
Notice of Allowance for U.S. Appl. No. 11/952,670, mailed Oct. 21, 2009, 6 pages.
Notice of Allowance for U.S. Appl. No. 11/952,670, mailed Aug. 24, 2012, 7 pages.
Notice of Allowance for U.S. Appl. No. 14/447,847, mailed Feb. 29, 2016, 7 pages.
Notice of Allowance for U.S. Appl. No. 14/447,847, mailed Mar. 31, 2016, 7 pages.
Corrected Notice of Allowability for U.S. Appl. No. 14/447,847, mailed Jul. 15, 2016, 4 pages.
Final Office Action for U.S. Appl. No. 13/906,892, mailed Feb. 11, 2016, 10 pages.
Advisory Action for U.S. Appl. No. 13/906,892, mailed Jun. 15, 2016, 2 pages.
Final Office Action for U.S. Appl. No. 13/906,892, mailed Aug. 26, 2016, 11 pages.
Advisory Action for U.S. Appl. No. 13/906,892, mailed Nov. 28, 2016, 3 pages.
Final Office Action for U.S. Appl. No. 13/906,892, mailed Dec. 15, 2016, 11 pages.
Advisory Action for U.S. Appl. No. 13/906,892, mailed Mar. 14, 2017, 3 pages.
Non-Final Office Action for U.S. Appl. No. 13/906,892, mailed Apr. 3, 2017, 9 pages.
Notice of Allowance for U.S. Appl. No. 13/906,892, mailed May 19, 2017, 9 pages.
Non-Final Office Action for U.S. Appl. No. 16/390,761, mailed Dec. 27, 2019, 9 pages.
Hearing Notice for Indian Patent Application No. 8469/DELNP/2009, mailed Dec. 26, 2019, 3 pages.
Notice of Allowance for U.S. Appl. No. 16/390,761, mailed Mar. 24, 2020, 7 pages.
International Search Report and Written Opinion for International Patent Application No. PCT/US2019/066721, mailed Apr. 24, 2020, 16 pages.
Non-Final Office Action for U.S. Appl. No. 16/372,910, mailed Mar. 30, 2020, 13 pages.
Final Office Action for U.S. Appl. No. 16/372,910, mailed Aug. 13, 2020, 13 pages.
Non-Final Office Action for U.S. Appl. No. 16/390,761, mailed Aug. 20, 2020, 9 pages.
Advisory Action for U.S. Appl. No. 16/372,910, mailed Oct. 27, 2020, 3 pages.
Non-Final Office Action for U.S. Appl. No. 16/372,910, mailed Dec. 31, 2020, 13 pages.
Notice of Allowance for U.S. Appl. No. 16/372,910, mailed May 18, 2021, 8 pages.
Final Office Action for U.S. Appl. No. 16/390,761, mailed Dec. 28, 2020, 8 pages.
Advisory Action for U.S. Appl. No. 16/390,761, mailed Feb. 25, 2021, 3 pages.
Non-Final Office Action for U.S. Appl. No. 16/390,761, mailed Apr. 15, 2021, 6 pages.
Notice of Allowance for U.S. Appl. No. 16/390,761, mailed Aug. 27, 2021, 7 pages.
Non-Final Office Action for U.S. Appl. No. 16/893,941, mailed Sep. 23, 2020, 8 pages.
Notice of Allowance for U.S. Appl. No. 16/893,941, mailed Feb. 26, 2021, 7 pages.
Non-Final Office Action for U.S. Appl. No. 16/579,080, mailed Dec. 10, 2020, 9 pages.
Notice of Allowance for U.S. Appl. No. 16/579,080, mailed Apr. 22, 2021, 7 pages.
Examination Report for European Patent Application No. 19842448.3, mailed Dec. 2, 2021, 7 pages.
Examination Report for European Patent Application No. 19842448.3, mailed Jun. 7, 2022, 6 pages.

(56) References Cited

OTHER PUBLICATIONS

International Preliminary Report on Patentability for International Patent Application No. PCT/US2019/066721, mailed Jul. 1, 2021, 10 pages.
Non-Final Office Action for U.S. Appl. No. 16/417,815, mailed Sep. 16, 2020, 14 pages.
Non-Final Office Action for U.S. Appl. No. 16/417,815, mailed Mar. 22, 2021, 15 pages.
Final Office Action for U.S. Appl. No. 16/417,815, mailed Sep. 8, 2021, 13 pages.
Advisory Action, Applicant-Initiated Interview Summary, and AFCP 2.0 Decision for U.S. Appl. No. 16/417,815, mailed Nov. 23, 2021, 5 pages.
Non-Final Office Action for U.S. Appl. No. 16/417,815, mailed Jan. 5, 2022, 14 pages.
Notice of Allowance for U.S. Appl. No. 16/417,815, mailed Jul. 26, 2022, 9 pages.

\* cited by examiner

ELECTROMAGNETIC SHIELDS WITH BONDING WIRES FOR SUB-MODULES

RELATED APPLICATIONS

This application is a continuation of U.S. patent application Ser. No. 16/417,815, filed May 21, 2019, now U.S. Pat. No. 11,515,282, the disclosure of which is hereby incorporated herein by reference in its entirety.

FIELD OF THE DISCLOSURE

The present disclosure relates to electromagnetic shields for electronic devices, and particularly to electromagnetic shields with bonding wires for sub-modules of electronic devices.

BACKGROUND

Electronic components have become ubiquitous in modern society. The electronics industry routinely announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed transitions inherently mean higher frequencies. Higher frequencies mean shorter wavelengths, requiring shorter conductive elements to act as antennas to broadcast these electromagnetic emissions. The electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have many radiating elements that raise EMI concerns. Thus, even electronic modules that do not have high clock speeds may need to address EMI issues.

One way to reduce EMI to comply with FCC regulations is to electromagnetically shield the electronic modules. Typically a shield is formed from a grounded conductive material that surrounds an electronic module. When electromagnetic emissions from the electronic module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the electronic module experiences reduced EMI from other electronic modules.

However, as electronic modules continue to become smaller from miniaturization, creating effective shields that do not materially add to the size of modules becomes more difficult. Thus, there is a need for an electromagnetic shield that is inexpensive to manufacture on a large scale, does not substantially increase the size of electronic modules, and effectively deals with EMI concerns.

SUMMARY

The present disclosure relates to electromagnetic shields for electronic devices, and particularly to electromagnetic shields with bonding wires for sub-modules of electronic devices. Electronic modules as disclosed herein may include multiple sub-modules arranged on a substrate with an electromagnetic shield arranged on or over the sub-modules. Bonding wires are disclosed that form one or more bonding wire walls along the substrate. The one or more bonding wire walls may be located between sub-modules of a module and about peripheral boundaries of the module. In certain embodiments, the electromagnetic shield is electrically coupled to ground by way of the one or more bonding wire walls. Portions of the electromagnetic shield and the one or more bonding wire walls may form divider walls that are configured to reduce electromagnetic interference (EMI) between the sub-modules or from external sources.

In one aspect, an electronic module comprises: a substrate; a first sub-module and a second sub-module arranged on a mounting surface of the substrate; a first plurality of bonding wires on the substrate that form a first bonding wire wall arranged between the first sub-module and the second sub-module; and an electromagnetic shield arranged on the first sub-module and the second sub-module, and a portion of the electromagnetic shield extends toward the substrate between the first sub-module and the second sub-module; wherein the first bonding wire wall and the portion of the electromagnetic shield that extend towards the substrate between the first sub-module and the second sub-module form a divider wall that reduces EMI between the first sub-module and the second sub-module. The electronic module may further comprise a second bonding wire wall that is arranged between the first sub-module and the second sub-module and adjacent to the first bonding wire wall, the second bonding wire wall formed from a second plurality of bonding wires. In certain embodiments, the first bonding wire wall is arranged with a parallel alignment to the second bonding wire wall. In certain embodiments, the first plurality of boding wires of the first bonding wire wall are arranged with a staggered alignment to the second plurality of boding wires of the second bonding wire wall. In certain embodiments, the first bonding wire wall is arranged with a non-linear alignment to the second bonding wire wall. In certain embodiments, the electromagnetic shield is electrically coupled to ground by way of the first bonding wire wall. The electronic module may further comprise an overmold body that is continuous across the first sub-module and the second sub-module. In certain embodiments, the first bonding wire wall is at least partially embedded in the overmold body. In certain embodiments, the portion of the electromagnetic shield that extends towards the substrate is arranged in an opening formed in the overmold body. The electronic module may further comprise a fill material arranged in the opening. In certain embodiments, the portion of the electromagnetic shield that extends toward the substrate is arranged in a plurality of openings formed in the overmold body.

In another aspect, an electronic module comprises: a substrate; a first sub-module and a second sub-module arranged on a mounting surface of the substrate; a first plurality of bonding wires on the substrate that form a first bonding wire wall arranged between the first sub-module and the second sub-module; a second plurality of bonding wires on the substrate that form a second bonding wire wall arranged about a peripheral boundary of the module; and an electromagnetic shield arranged on the first sub-module and the second sub-module, wherein the electromagnetic shield is electrically coupled to the first bonding wire wall and the second bonding wire wall. The electronic module may further comprise an overmold body that is continuous across the first sub-module and the second sub-module. In certain embodiments, the first bonding wire wall is at least partially embedded in the overmold body. In certain embodiments, the portion of the electromagnetic shield that extends towards the substrate is arranged in an opening formed in the overmold body. In certain embodiments, a height of the first bonding wire wall above the substrate is different that a height of the second bonding wire wall above the substrate. In certain embodiments, the electromagnetic shield is electrically coupled to ground by way of the first bonding wire wall and the second bonding wire wall.

In another aspect, an electronic module comprises: a substrate; a first sub-module and a second sub-module arranged on a mounting surface of the substrate; a first plurality of bonding wires on the substrate that form a first bonding wire wall, the first bonding wire wall forming a first height above the substrate; a second plurality of bonding wires on the substrate that form a second bonding wire wall, the second bonding wire wall forming a second height above the substrate that is less than the first height; and an electromagnetic shield arranged on the first sub-module and the second sub-module, wherein the electromagnetic shield is electrically coupled to the first bonding wire wall and the second bonding wire wall. In certain embodiments, the first bonding wire wall and the second bonding wire wall are arranged between the first sub-module and the second sub-module. In certain embodiments, the first bonding wire wall is arranged between the first sub-module and the second sub-module, and the second bonding wire wall is arranged about a peripheral boundary of the module. In certain embodiments, the second bonding wire wall is arranged between the first sub-module and the second sub-module, and the first bonding wire wall is arranged about a peripheral boundary of the module. In certain embodiments, the electromagnetic shield is electrically coupled to ground by way of the first bonding wire wall and the second bonding wire wall.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
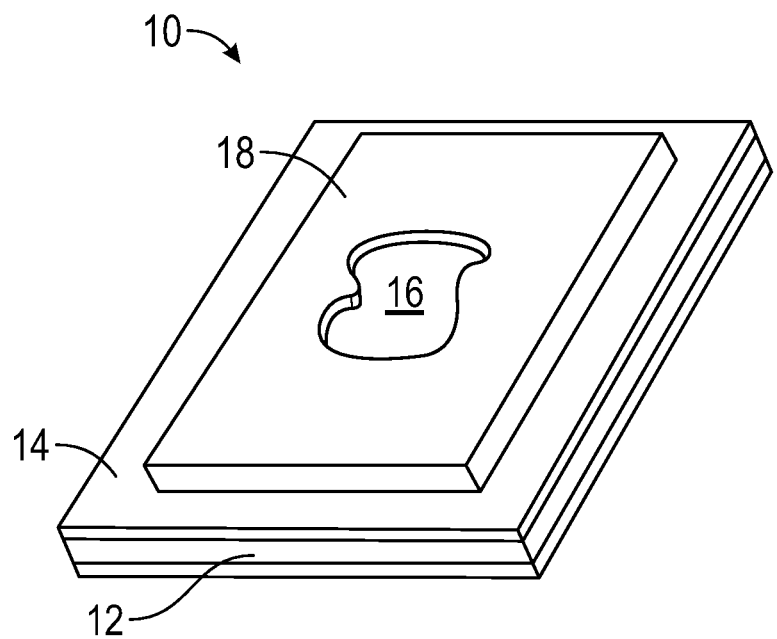
FIG. 1A illustrates a representative module having one sub-module, which is covered by an overmold body according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be a limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to electromagnetic shields for electronic devices, and particularly to electromagnetic shields with bonding wires for sub-modules of electronic devices. Electronic modules as disclosed herein may include multiple sub-modules arranged on a substrate with an electromagnetic shield arranged on or over the sub-modules. Bonding wires are disclosed that form one or more bonding wire walls along the substrate. The one or more bonding wire walls may be located between sub-modules of a module and about peripheral boundaries of the module. In certain embodiments, the electromagnetic shield is electrically coupled to ground by way of the one or more bonding wire walls. Portions of the electromagnetic shield and the one or more bonding wire walls may form divider walls that are configured to reduce electromagnetic interference (EMI) between the sub-modules or from external sources.

The present disclosure may be used to form one or more electromagnetic shields for corresponding component areas of a given electronic module. In certain embodiments, a meta-module having circuitry for two or more modules is formed on a substrate structure, which may include a laminated substrate structure. As such, the circuitry for different modules is initially formed on the single meta-module. Each module will have one or more component areas in which the circuitry is formed. A metallic structure is formed on or in the substrate for each component area to be shielded on the substrate. The metallic structure may be formed from traces, vias, metallic layers, metallic components, plating materials, or the like, as well as any combination thereof. In one embodiment, each metallic structure extends about all or a portion of the periphery of each of the component areas to be shielded. A single body, such as an overmold body, is then formed over all of the modules on the meta-module. After the body is formed, at least a portion of the metallic structure for each component area to be shielded is exposed through the body by a cutting, drilling, or like operation. Next, an electromagnetic shield material is applied to an exterior surface of the body of each of the component areas to be shielded and in contact with the exposed portion of the metallic structures. The modules are then singulated from each other to form separate modules, each of which having one or more integrally shielded component areas.

In certain embodiments, the electromagnetic shield material is provided using an electroless plating process, which deposits a conductive seed layer on the overmold body and in contact with the exposed portions of the metallic structures. Then, an electrolytic plating process is used to deposit a second conductive layer onto the conductive seed layer. A final layer of a metallic material, such as nickel (Ni), is then deposited on top of the second conductive layer through an electrolytic plating process. In another embodiment, the electromagnetic shield material is provided by applying a conductive epoxy or paint to the body and in contact with the exposed portions of the metallic structures. In other embodiments, the electromagnetic shield material may be provided by metallized thin film-based processes, such as, for example physical vapor deposition, sputtering, evaporation, chemical vapor deposition, and/or atomic layer deposition, among others. In these embodiments, the conductive layers create an integrated electromagnetic shield for one or more component areas of a module to reduce EMI.

For the following description, the preferred embodiments of the present disclosure are described. The scope of the disclosure and the claims that follow shall not be limited to these preferred embodiments. For example, the metallic structure in the preferred embodiments is formed in whole or in part from a metallic layer grid that resides on or in the surface of the substrate. Further, the metallic structure resides along all or a portion of the periphery of one or more component areas. These embodiments lend themselves to efficient processing; however, those skilled in the art will recognize that the metallic structure to which the integrated electromagnetic shield is connected need not reside along the periphery of the component area, or be part of a metallic layer grid. Importantly, the metallic structure may take virtually any form or shape, and may reside on or in the top surface of the substrate. The metallic structure may merely be a single point along the top surface of the module, or a continuous or segmented structure that extends along all or a portion of the one or more component areas to be shielded. Accordingly, the metallic layer grid used in the following embodiments to provide a metallic structure is merely provided to illustrate the preferred embodiments, and as such, shall not limit what constitutes a metallic structure or how a metallic structure is formed according to the present disclosure.

Figure 1B:
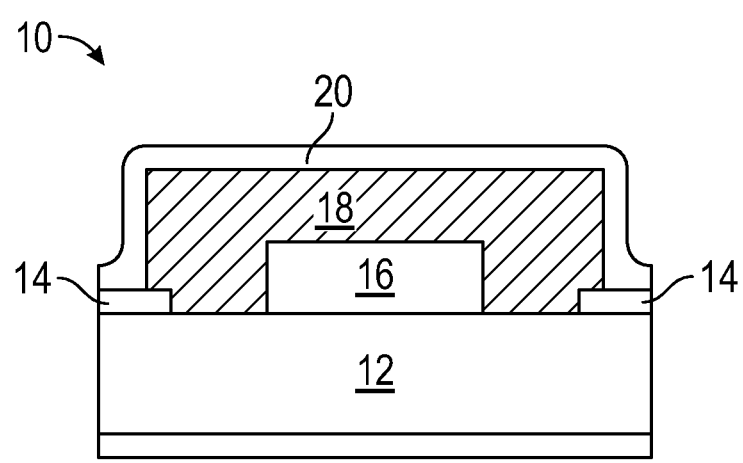
FIG. 1B illustrates a cross-section of the module of FIG. 1A in which an integrated electromagnetic shield is provided according to embodiments disclosed herein.

A module 10 is illustrated in FIG. 1A and FIG. 1B according to certain embodiments of the present disclosure. The module 10 has a substrate 12, which may include a laminate structure that comprises a metallic structure formed from a metallic layer grid 14 on or in a top surface of the substrate 12. In certain embodiments, the substrate 12 may comprise an epoxy laminate, such as FR-4 and the like. The substrate 12 may also be formed from other materials including ceramics and/or alumina. As indicated above, any metallic structure may be used; however, the preferred embodiment uses a portion of the metallic layer grid 14 to form a peripheral metallic structure. The metallic layer grid 14 may comprise any number of conductive materials, including one or more of gold (Au), silver (Ag), copper (Cu), and alloys thereof. Only one section of the metallic layer grid 14 is depicted in these figures and the peripheral metallic structure is not separately labeled, as it is formed from the metallic layer grid 14. The illustrated module 10 has a single component area 16 that lies within the peripheral metallic structure and in which circuitry for the module 10 is formed. The component area 16 may include one or more electronic components of various types depending on the application. For example, the electronic components may include an electronic circuit built on its own semiconductor substrate, such as a processor, volatile memory, non-volatile memory, a radio frequency (RF) circuit, or a micro-mechanical system (MEMS) device. In certain embodiments, the electronic components may include one or more electrical devices such as filters, capacitors, inductors, resistors, amplifiers, low-noise amplifiers (LNA), switching devices, transmit/receive modules, or electronic circuits having combinations thereof. A body, such as an overmold body 18 or overmold material, resides over the substrate 12 and encompasses the component area 16. The overmold body 18 may comprise one or more insulating or dielectric materials. In this regard, the overmold body 18 may be configured to provide encapsulation and electrical isolation for the electronic components that are mounted to the component area 16 of the substrate 12. In certain embodiments, exposed surfaces of the overmold bodies 18 may be cleaned, such as by a plasma cleaning process, to remove wax or other organic compounds and materials that remain on the surface of each overmold body 18. The plasma cleaning process subjects the surface of each overmold body 18 to a reactive process gas, such as argon (Ar), oxygen (O), nitrogen (N), hydrogen (H), carbon tetrafluoride ($CF_4$), sulfur hexafluoride ($SF_6$), nitrogen tri-fluoride ($NF_3$), or the like, which effectively etches away contaminants on the exposed surface of each overmold body 18. In essence, the contaminants are vaporized, burned, or otherwise removed from the exposed surface of the overmold body 18 when exposed to the process gas. In certain embodiments, the cleaned surface of each overmold body 18 may be roughened through an abrasion process, a desmear technique, or like process. In one embodiment, a chemical roughening process is provided. It should be appreciated that a mask (not shown) may be positioned on the underside of the substrate 12 so that the processes described in the steps below do not interfere with any electrical contacts that may be present on the bottom side of the substrate 12. The mask helps prevent liquids and gases from reaching these electrical contacts, which may act as input/output contacts for one or more components of the component area 16. Alternatively, a seal structure may be employed.

As depicted in FIG. 1B, an electromagnetic shield 20 is integrally formed over the overmold body 18 and in contact with exposed portions of the peripheral metallic structure of the metallic layer grid 14 to provide shielding from electromagnetic emissions. In certain embodiments, the peripheral metallic structure of the metallic layer grid 14 is coupled to ground and accordingly, the electromagnetic shield 20 is electrically grounded. In this manner, electromagnetic emissions that strike the electromagnetic shield 20 are electrically shorted to ground, thereby reducing EMI. The electromagnetic shield 20 may comprise a single layer or a plurality of layers. In certain embodiments, the electromagnetic shield 20 may comprise a first layer comprising a seed layer followed by one or more additional layers. For example, the seed layer may comprise a conductive material such as Cu, aluminum (Al), Ag, Au, or combinations thereof deposited by electroless plating or the like. A second layer may be subsequently formed on the seed layer comprising a metal such as Cu, Al, Ag, Au, or combinations thereof deposited by electrolytic plating or the like, followed by a third layer formed on the second layer, wherein the third layer comprises a less conductive material, such as Ni or other metals, than the first or second layers. The third layer may also be formed by electrolytic plating. The third layer may be provided to protect the first or second layers from tarnishing, corrosion, or other environmental effects. Likewise, the third layer may contribute to shielding by absorbing some electromagnetic radiation. In an exemplary embodiment, the electromagnetic shield 20 may be formed with an approximate thickness in a range from about 10 microns (μm) to about 50 μm. Greater or lesser thicknesses may also be generated. For example, in certain embodiments, the thickness of the electromagnetic shield 20 may be reduced to a range from about 5 μm to about 10 μm. In certain embodiments, the electromagnetic shield 20 may be referred to as a microshield.

Figure 2A:
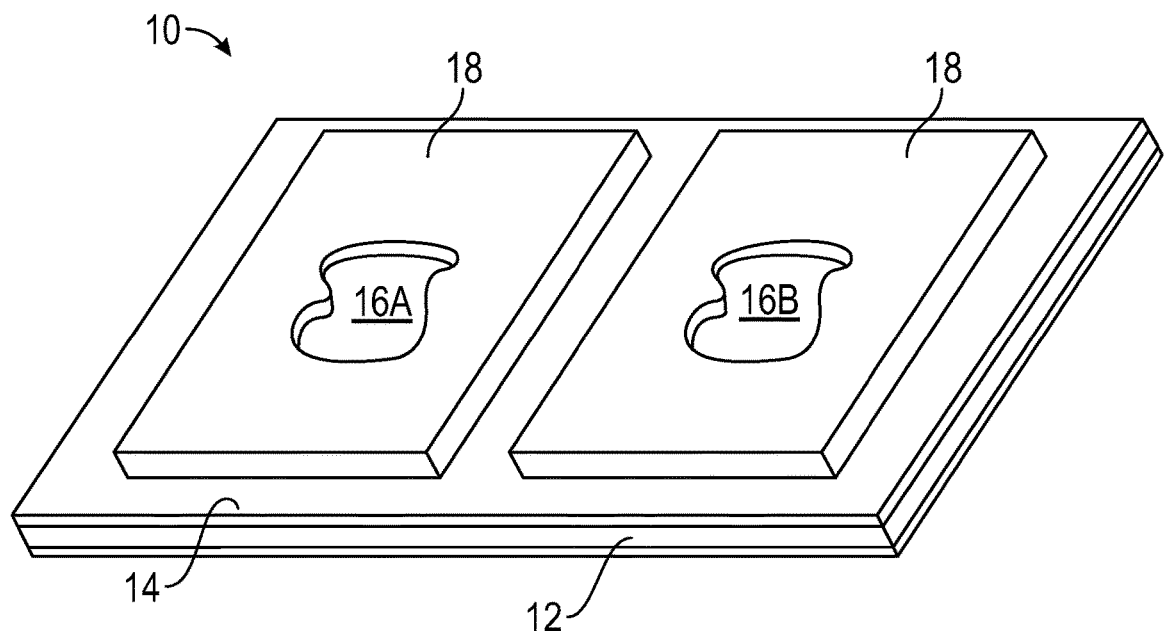
FIG. 2A illustrates a module having two sub-modules, which are covered by an overmold body according to embodiments disclosed herein.
Figure 2B:
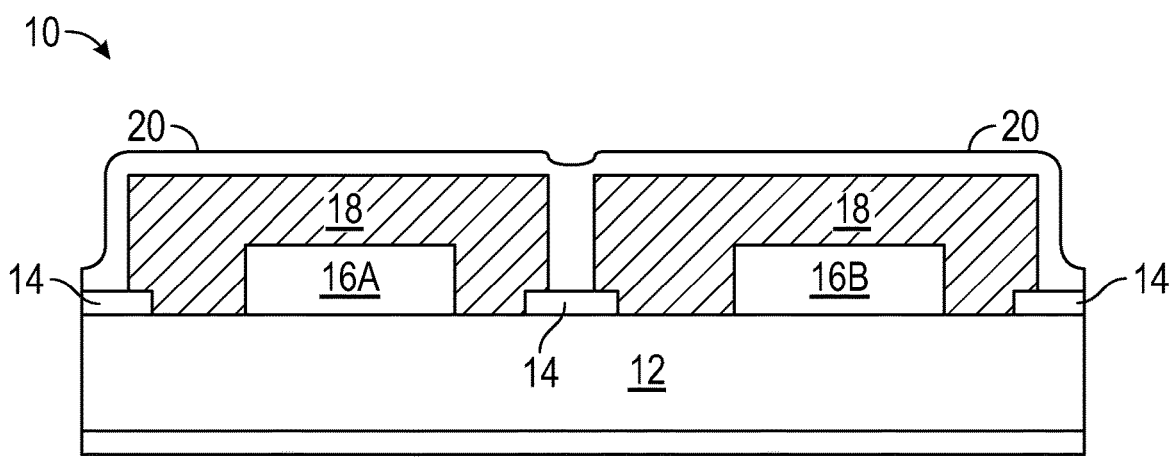
FIG. 2B illustrates a cross-section of the module of FIG. 2A in which an integrated electromagnetic shield is provided according to embodiments disclosed herein.

A given module 10 may include any number of component areas 16 where one or more of the component areas 16 have a corresponding electromagnetic shield 20. As illustrated in FIGS. 2A and 2B, two component areas 16A and 16B are positioned in the metallic layer grid 14 such that a peripheral metallic structure is provided for each of the component areas 16A and 16B. The two component areas 16A and 16B may be configured as two sub-modules within the module 10. In certain instances, the peripheral metallic structures for the adjacent component areas 16A and 16B may share a common section of the metallic layer grid 14. The illustrated module 10 has the two component areas 16A and 16B, which lie within corresponding peripheral metallic structures and in which circuitry (not illustrated) for the module 10 is formed. Overmold bodies 18 reside over the substrate 12 and encompass the respective component areas 16A and 16B. As depicted in FIG. 2B, one or more electromagnetic shields 20 are integrally formed over the overmold bodies 18 and in contact with exposed portions of the respective peripheral metallic structures of the metallic layer grid 14. In particular, the one or more electromagnetic shields 20 encompass both of the component areas 16A and 16B and further extend between the component areas 16A and 16B. A portion of the one or more electromagnetic shields 20 that is arranged between the component areas 16A and 16B may be referred to as an electromagnetic shield divider wall. In the manner, EMI from outside sources and EMI between the component areas 16A and 16B may be reduced. Although the component areas 16A and 16B of the module 10 are illustrated as being adjacent one another, they may also be substantially separated from one another. In this manner, the module 10 is configured to include multiple sub-modules, each of which includes one of the component areas 16A or 16B as well as the corresponding overmold body 18 and the corresponding electromagnetic shield 20 or a portion of the electromagnetic shield 20. During fabrication, a continuous overmold material may be blanket deposited over the two component areas 16A and 16B. A selective removal process may then be applied to the continuous overmold material to form the overmold bodies 18. The selective removal process may include at least one of cutting, drilling, etching, grinding, or the like to expose portions of the metallic layer grid 14 that are coupled to ground. Accordingly, the electromagnetic shield 20 that is subsequently deposited is electrically grounded by way of the previously exposed portions of the metallic layer grid 14. During the selective removal process, damage to the metallic layer grid 14 or the substrate 12 may occur due to exposure to the cutting, drilling, etching, or grinding.

As disclosed herein, improved EMI shielding between sub-modules may be provided with certain arrangements of divider walls that are provided between sub-modules. In certain embodiments, a portion of a divider wall may be formed with material from an electromagnetic shield that is formed over the sub-modules and another portion of the divider wall may include a bonding wire wall, which may also be referred to as a wire bond wall. The bonding wire wall may be formed between sub-modules on a substrate before application of an overmold material. In this manner, the bonding wire wall may be at least partially embedded within the overmold material. In certain embodiments, a portion of the overmold material that is registered with the bonding wire wall is selectively removed to expose portions of the bonding wire wall, such that the electromagnetic shield that is subsequently deposited may be electrically coupled to the bonding wire wall. In this manner, the selective removal process is halted before portions of the substrate or metallization on the substrate are exposed, thereby providing protection for the substrate and the metallization.

Figure 3A:
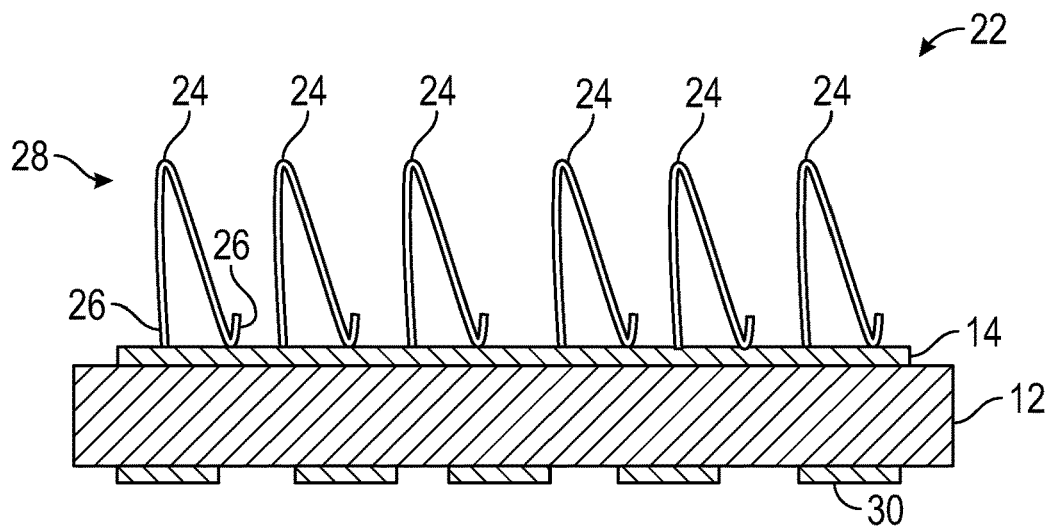
FIG. 3A is a cross-sectional view of an exemplary module that includes bonding wires that form a bonding wire wall according to embodiments disclosed herein.

FIG. 3A is a cross-sectional view of an exemplary module 22 that includes bonding wires 24 that form a bonding wire wall 28 according to embodiments disclosed herein. As illustrated, the bonding wires 24 are arranged on the substrate 12 and are bonded or otherwise electrically coupled to portions of the metallic layer grid 14 for electrical grounding. The bonding wires 24 may comprise any number of conductive materials, including one or more of palladium (Pd) coated Cu, Cu, Au, Ag, Al, and alloys thereof. The bonding wires 24 may be between 0.6 mil and 2.0 mil diameter and may include wire loops whose ends 26 are bonded to the metallic layer grid 14 through an appropriate technique, such as ultrasonic bonding (e.g., ball bonding, wedge bonding), compliant bonding, soldering, combinations of these techniques, and the like. The ends 26 of the bonding wires 24 may be generally separated from one another in certain embodiments. In an exemplary aspect, the bonding wires 24 may span a distance in a range from 350 µm to 550 µm, and the ends 26 of the bonding wires 24 may be separated by at least 80 µm. By forming a bonding wire wall 28 of electrically grounded bonding wires 24, the bonding wire wall 28 is configured to reduce EMI between sub-modules or electrical components that are arranged on opposing sides of the bonding wire wall 28. The substrate 12 may additionally include one or more module contacts 30.

Figure 3B:
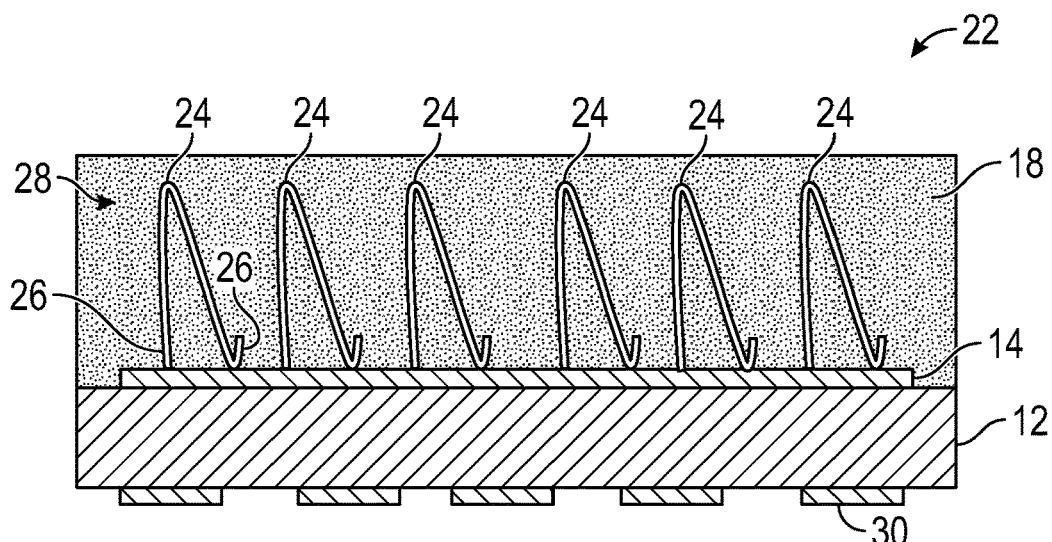
FIG. 3B is a cross-sectional view of the module of FIG. 3A, after an overmold body has been formed.

FIG. 3B is a cross-sectional view of the module 22 of FIG. 3A, after the overmold body 18 has been formed. The overmold body 18 is applied over the substrate 12 (e.g., over a top face of the substrate 12) to encapsulate each electronic component on the surface of the substrate 12 and the bonding wire wall 28. The overmold body 18 may be an organic epoxy resin or similar material deposited at a thickness of 350 µm or greater. The overmold body 18 may be applied by various procedures, such as sheet molding, overmolding, compression molding, transfer molding, dam fill encapsulation, or screen print encapsulation. In an exemplary aspect, the overmold body 18 fills any space below the bonding wires 24 and a curing process hardens the overmold body 18, thereby providing mechanical stability and encapsulation for the bonding wire wall 28.

Figure 3C:
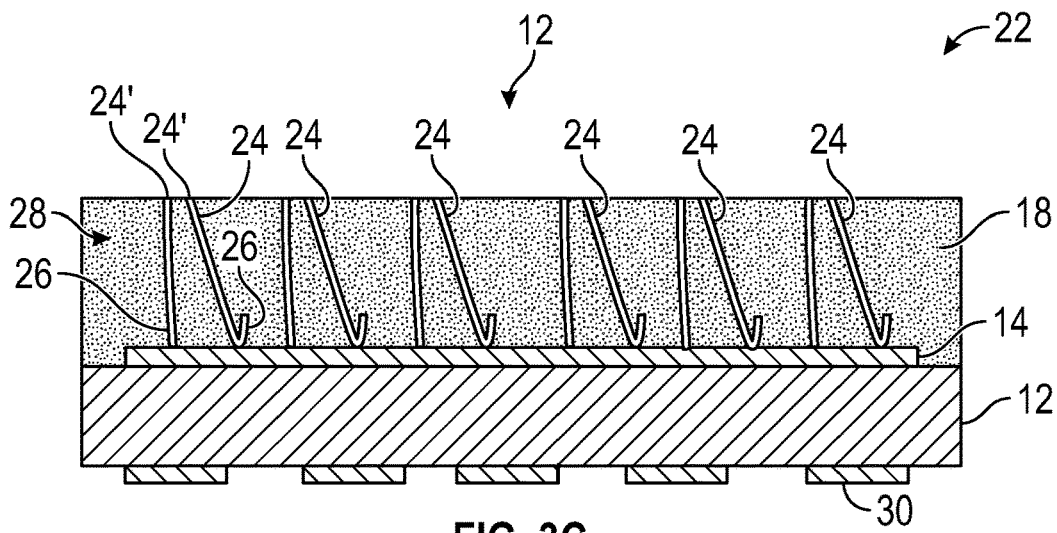
FIG. 3C is a cross-sectional view of the module of FIG. 3B, after a removal process has been applied to a portion of the overmold body.

FIG. 3C is a cross-sectional view of the module 22 of FIG. 3B, after a removal process has been applied to a portion of the overmold body 18. As illustrated, a portion of the overmold body 18 is removed to form exposed surfaces 24' of the bonding wires 24. The exposed surfaces 24' are formed through an appropriate technique, such as by cutting, drilling, etching, grinding (e.g., strip level grinding), or the like on portions of a top surface of the overmold body 18. By way of a non-limiting example, if the overmold body 18 is initially formed with a thickness of 350 µm or greater, the removal process may reduce a thickness of at least a portion of the overmold body 18 to a thickness of 320 µm. In certain embodiments, the removal process also removes a portion of the bonding wires 24, thereby forming the exposed surfaces 24' of the bonding wires 24 at the top surface of the overmold body 18.

Figure 3D:
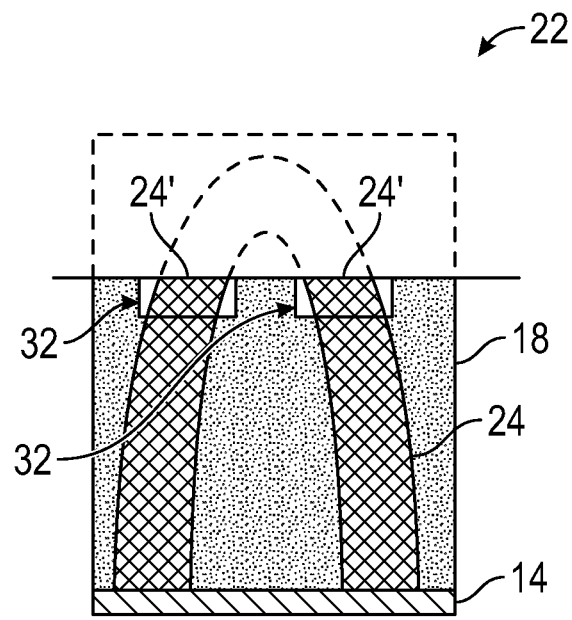
FIG. 3D is a cross-sectional view of a portion of the module of FIG. 3C, illustrating a cavity formed around bonding wires according to embodiments disclosed herein.

FIG. 3D is a cross-sectional view of a portion of the module 22 of FIG. 3C, illustrating a cavity 32 formed around the bonding wires 24 in certain embodiments. In an exemplary aspect, the cavity 32 is formed by laser ablating portions of the overmold body 18 about each of the exposed surfaces 24' of the bonding wires 24. Other techniques may also be applied, such as mechanical removal (e.g., water jets, grinding), ion milling, chemical removal, and the like. The cavity 32 may form a width in a range including 1 µm to 20 µm about each bonding wire 24, and may form a depth in a range including 1 µm to 10 µm. The cavity 32 may further be cleaned in a chemical bath (e.g., with a permanganate etchant) and/or plated with an electroless or electroless/electrolytic plating process. By forming the cavity 32 about the exposed surfaces 24' of the bonding wires 24, increased surface area is provided for bonding with subsequently deposited materials, (e.g., metal layers of the electromagnetic shield 20 as described below in FIG. 3E). In other embodiments, the cavity 32 may be omitted.

Figure 3E:
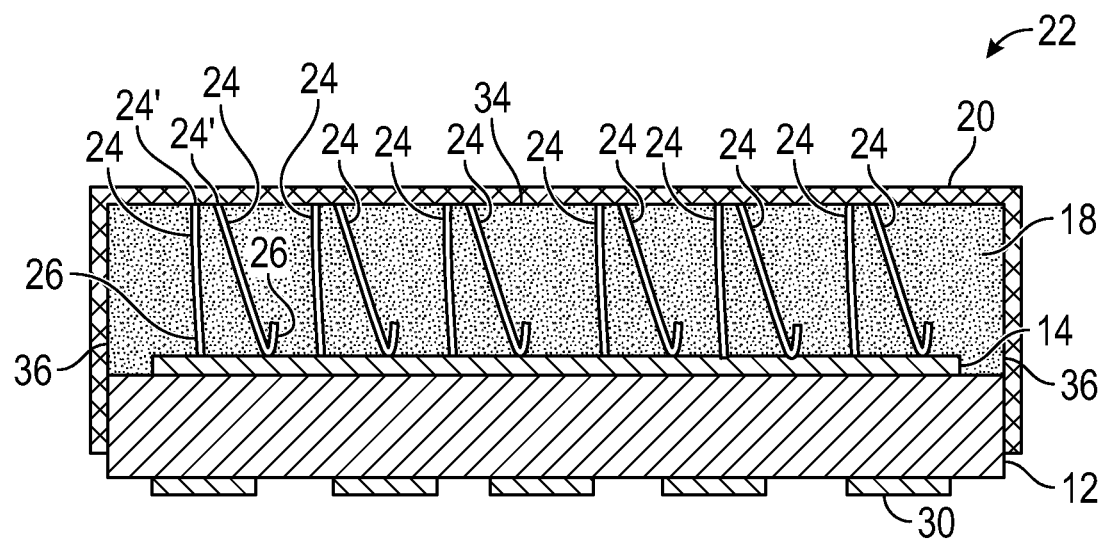
FIG. 3E is a cross-sectional view of the module of FIG. 3C, after an electromagnetic shield has been formed.

FIG. 3E is a cross-sectional view of the module 22 of FIG. 3C, after the electromagnetic shield 20 has been formed. The electromagnetic shield 20 is deposited over the overmold body 18 and may be electrically coupled with the exposed surfaces 24' of the bonding wires 24. In an exemplary aspect, the electromagnetic shield 20 entirely covers a top surface 34 of the overmold body 18 and entirely or almost entirely covers one or more side surfaces 36 of the overmold body 18. As disclosed herein, entirely covering a surface refers to covering at least 99% of the surface, while almost entirely covering a surface refers to covering at least 90% of the surface.

Figure 4:
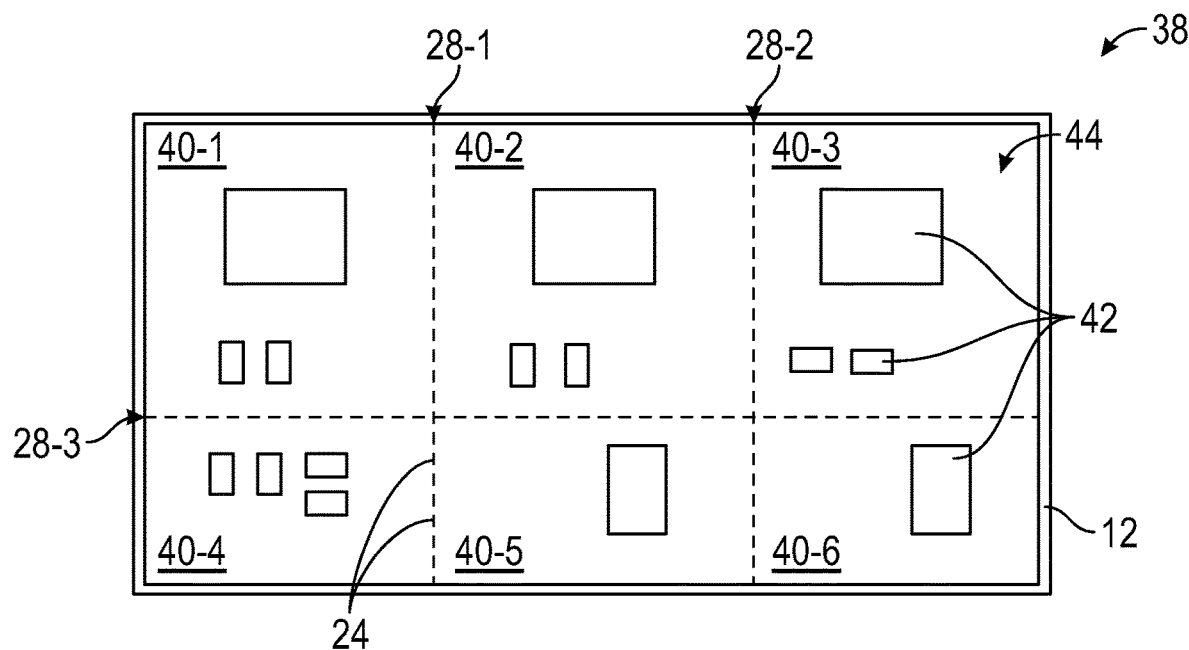
FIG. 4 is a top view of a module that includes a plurality of sub-modules and one or more bonding wire walls according to embodiments disclosed herein.

FIG. 4 is a top view of a module 38 that includes a plurality of sub-modules 40-1 to 40-6 and one or more bonding wire walls 28-1 to 28-3 according to embodiments disclosed herein. Each of the sub-modules 40-1 to 40-6 may include one or more electronic components 42 as described above that are arranged on a mounting surface 44 of the substrate 12. The bonding wire walls 28-1 to 28-3 are arranged between the sub-modules 40-1 to 40-6 to define borders between different ones of the sub-modules 40-1 to 40-6. For example, a first bonding wire wall 28-1 is arranged between a first sub-module 40-1 and a second sub-module 40-2. The first bonding wire wall 28-1 is additionally arranged between a fourth sub-module 40-4 and a fifth sub-module 40-5. As previously described, each of the bonding wire walls 28-1 to 28-3 are formed with a plurality of bonding wires 24. In this manner, at least one bonding wire wall 28-1 to 28-3 is arranged between each of the sub-modules 40-1 to 40-6 to provide reduced EMI between the electronic components 42 in adjacent ones of the sub-modules 40-1 to 40-6.

In certain embodiments, it is to be understood that the electronic components 42 may include one or more integrated circuit die comprised of a semiconducting material such as silicon, gallium arsenide, silicon germanium, or gallium nitride. The electronic components 42 may also include one or more surface mount components that might include capacitive, inductive, and/or resistive element(s). In certain embodiments, the electronic components 42 might include a microelectronics device packaged via techniques such as wafer level fan-out or fan-in methodologies. In other embodiments, one or more of the electronic components 42 may include one or more shielded modules or sub-modules (e.g. the module 10 of FIG. 1B or 2B or the module 22 of FIG. 3E having the electromagnetic shield 20). As such, it is to be further understood, that the electronic components 42 might wholly or in-part include one or more discrete system in package (SIP) devices, including but not limited to a shielded module within a larger shielded module.

Figure 5:
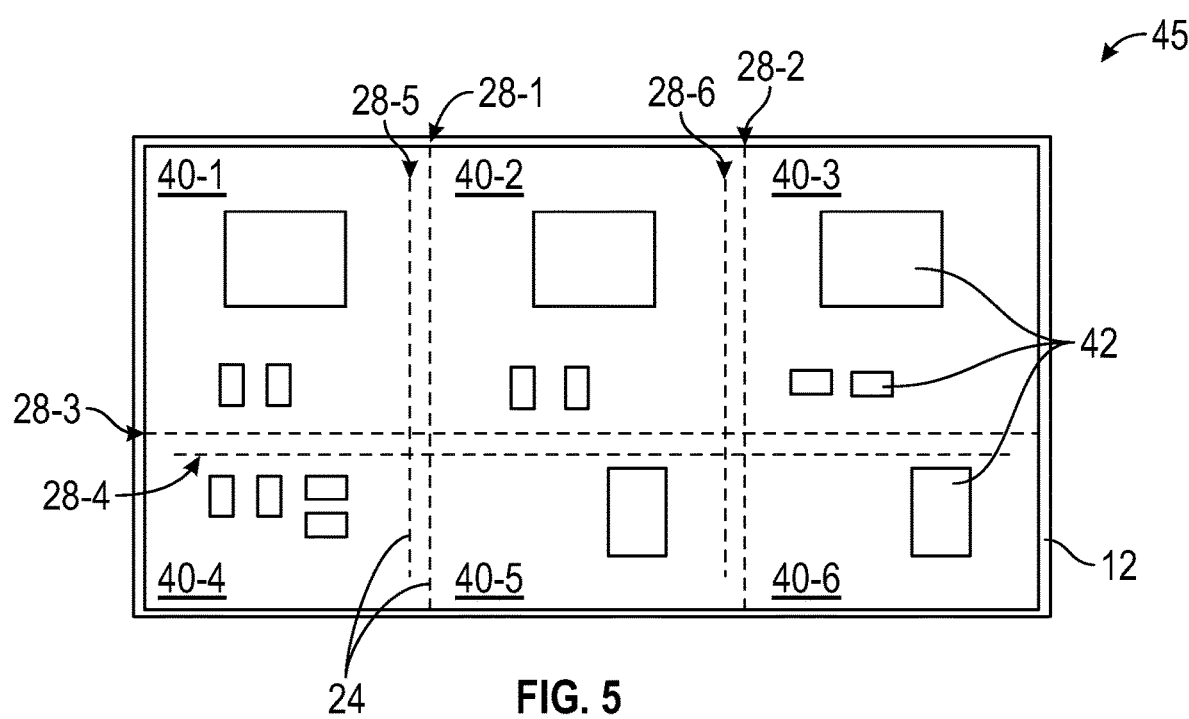
FIG. 5 is a top view of a module that is similar to the module of FIG. 4, but includes a greater number of bonding wire walls according to embodiments disclosed herein.

FIG. 5 is a top view of a module 45 that is similar to the module 38 of FIG. 4, but includes a greater number of bonding wire walls 28-1 to 28-6 according to embodiments disclosed herein. As illustrated, at least two of the bonding wires walls 28-1 to 28-6 are arranged between each of the sub-modules 40-1 to 40-6. For example, the bonding wire walls 28-1, 28-5 are arranged between the sub-modules 40-1, 40-2, and the bonding wire walls 28-2, 28-6 are arranged between the sub-modules 40-2, 40-3, and so on. In this manner, the bonding wire walls 28-1 to 28-6 may be configured to provide even further reduction in EMI between the electronic components 42 in adjacent ones of the sub-modules 40-1 to 40-6. While two rows of bonding wire walls 28-1 to 28-6 are illustrated in FIG. 5, it is understood that higher numbers of bonding wire walls 28-1 to 28-6 may be provided between adjacent ones of the sub-modules 40-1 to 40-6. For example, three bonding wire walls, or four bonding wire walls or more may be arranged adjacent ones of the sub-modules 40-1 to 40-6. In FIG. 5, adjacent rows of bonding wire walls 28-1 to 28-6 are arranged in generally parallel alignment between adjacent ones of the sub-modules 40-1 to 40-6, and the adjacent rows of bonding wire walls 28-1 to 28-6 intersect with other rows of the bonding wire walls 28-1 to 28-6 at various corners of the sub-modules 40-1 to 40-6. Other arrangements of bonding wire walls 28-1 to 28-6 are possible without departing from the principles of the present disclosure. For example, the bonding wire walls 28-1 to 28-6 may be provided in non-linear arrangements across the substrate 12, thereby forming non-linear boundaries of the sub-modules 40-1 to 40-6. In certain embodiments, each of the bonding wire walls 28-1 to 28-6 may from one or more curved walls around various ones of the sub-modules 40-1 to 40-6. In certain embodiments, the bonding wires 24 of the bonding wire wall 28-1 may be arranged in a staggered alignment with the bonding wires 24 of the adjacent bonding wire wall 28-5. In this manner, any gaps between individual bonding wires 24 of one bonding wire wall 28-1 may be at least partially aligned with a bonding wire 24 of the adjacent bonding wire wall 28-5, thereby providing improved reduction in EMI between adjacent sub-modules 40-1, 40-2.

Figure 6:
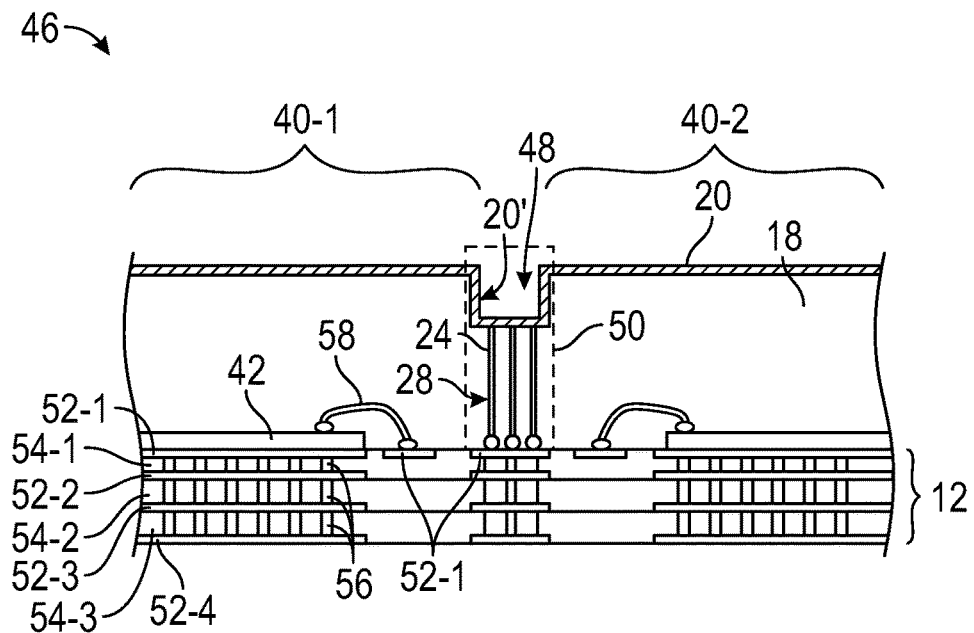
FIG. 6 is a cross-sectional view of a representative module that includes one or more bonding wire walls according to embodiments disclosed herein.

FIG. 6 is a cross-sectional view of a representative module 46 that includes one or more bonding wire walls 28 according to embodiments disclosed herein. As illustrated, the module 46 includes the first sub-module 40-1 and the second sub-module 40-2, although other numbers of sub-modules are possible without deviating from the principles of the present disclosure. As previously described, the first and second sub-modules 40-1, 40-2 may each comprise one or more electronic components 42 mounted on the substrate 12 that are within the overmold body 18. The module 46 further includes the electromagnetic shield 20 that is conformal over each of the sub-modules 40-1, 40-2. In particular, the electromagnetic shield 20 conformally covers the overmold body 18 and an opening 48 that is formed between the sub-modules 40-1, 40-2. In certain embodiments, the opening 48 is formed when a removal process is selectively applied to an area of the overmold body 18 that is registered between the sub-modules 40-1, 40-2. The removal process may include any of the processes as previously described for FIG. 3C to expose surfaces of the bonding wires 24 that are arranged between the sub-modules 40-1, 40-2. Notably, the opening 48 does not extend entirely through the overmold body 18 such that the overmold body 18 is continuous across the first and second sub-modules 40-1, 40-2. Additionally, portions of the bonding wires 24 of the bonding wire walls 28 are embedded in the overmold body 18. In certain embodiments, a width of the opening 48 measured as a distance from the first sub-module 40-1 to the second sub-module 40-2 may include a range from about 0.1 millimeters (mm) to about 3 mm, depending on the application and the removal process used to fabricate the opening 48. For example, sawing with a saw blade of a particular width may provide an opening 48 with a width that is at least equal to the width of the saw blade. As the electromagnetic shield 20 may be conformal to the opening, one or more portions 20' of the electromagnetic shield 20 extend toward the substrate 12 between the first and second sub-modules 40-1, 40-2, thereby forming one or more sidewalls of the electromagnetic shield 20 that are registered with the opening 48. In the cross-sectional view of FIG. 6, three bonding wires 24 are illustrated, which may represent portions of three different bonding wire walls 28 that are arranged adjacent to one another between the sub-modules 40-1, 40-2. As previously described, any number of bonding wires walls 28 may be arranged between the sub-modules 40-1, 40-2. The electromagnetic shield 20 may therefore be electrically coupled to the bonding wires 24 of the bonding wire walls 28 and electrically grounded by the substrate 12 as further described below. In this manner, the one or more bonding wire walls 28 and the one or more portions 20' of the electromagnetic shield 20 that extend toward the substrate 12 collectively form a divider wall 50 as indicated by the dashed box in FIG. 6. The divider wall 50 is thus configured to reduce EMI between the sub-modules 40-1, 40-2.

The substrate 12 may comprise a laminate structure that includes one or more metal layers 52-1 to 52-4 and one or more dielectric layers 54-1 to 54-3. One or more vias 56 may also be provided to provide electrical connections between different ones of the metal layers 52-1 to 52-4. In this regard, the substrate 12 may comprise a printed circuit board where the one or more metal layers 52-1 to 52-4 are laminated in an alternating configuration with the one or more dielectric layers 54-1 to 54-3. While four metal layers 52-1 to 52-4 are illustrated, the substrate 12 may be configured with any number of metal layers. Generally, increasing the number of laminated metal layers corresponds to an increased number of electronic components that may be mounted and electrically connected on a particular laminate structure. This allows electrical connections to various electronic components 42 to be made at different horizontal planes within the substrate 12. In certain embodiments, the one or more metal layers 52-1 to 52-4 may include Cu, Cu foil, or the like while the one or more dielectric layers 54-1 to 54-3 may include fiber materials, glass, epoxy, glass-reinforced epoxy, ceramic materials, polymer materials and combinations thereof. Each of the metal layers 52-1 to 52-4 may comprise a pattern of continuous portions and discontinuous portions along the substrate 12. Discontinuous portions of the same metal layer (e.g., 52-1) may be electrically isolated from one another. As illustrated, an electronic component 42 is mounted to a certain portion of a first metal layer 52-1 and then a wire bond connection 58 is provided to electrically connect the electronic component 42 to a different portion of the first metal layer 52-1. Additionally, the bonding wires 24 of the bonding wire walls 28 are electrically coupled to yet another portion of the first metal layer 52-1 that is electrically coupled to ground. In this manner, the electronic component 42 may be electrically activated by portions of the first metal layer 52-1 while the electromagnetic shield 20 and the bonding wire walls 28 are electrically grounded by a different portion of the first metal layer 52-1. The presence of one or more wire-bond connections 58 for the electronic components 42 can act as miniature antennas that facilitate undesirable leakage or interference of electromagnetic signals from the first sub-module 40-1 to the second sub-module 40-2. Accordingly, the divider wall 50 is arranged to reduce such interference. In other embodiments, one or more of the electronic components 42 may be flip-chip mounted on the substrate 12.

Figure 7:
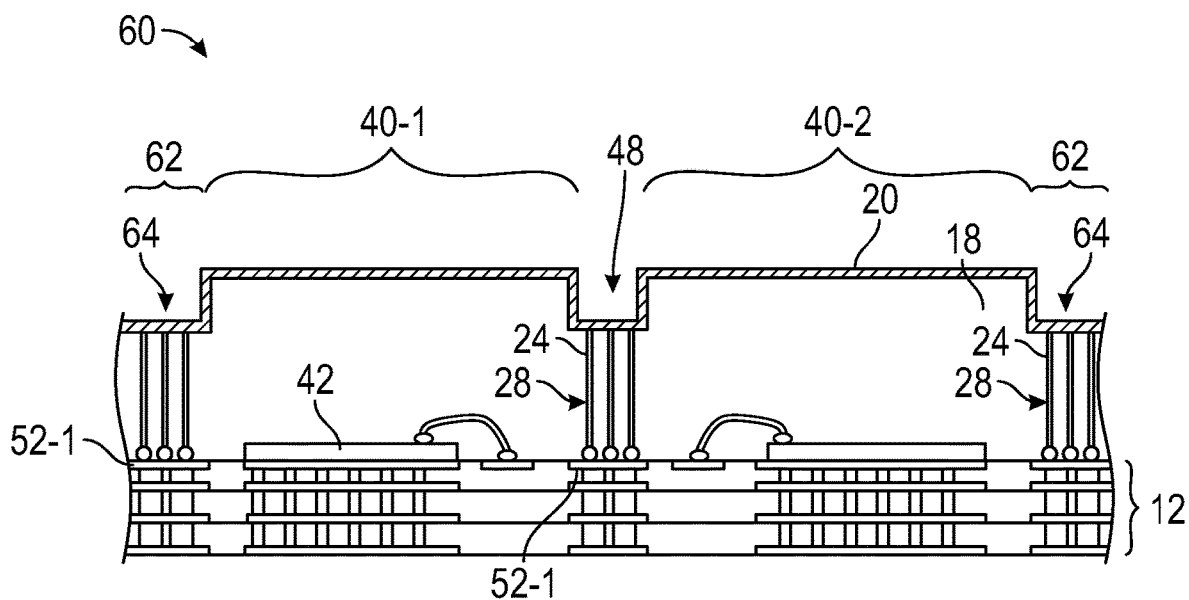
FIG. 7 is a cross-sectional view of a representative module that is similar to the module of FIG. 6 and further includes one or more bonding wire walls arranged along one or more peripheral boundaries of the module.

FIG. 7 is a cross-sectional view of a representative module 60 that is similar to the module 46 of FIG. 6 and further includes one or more bonding wire walls 28 arranged along one or more peripheral boundaries 62 of the module 60. As illustrated, the peripheral boundaries 62 of the module 60 are bounded by perimeters of the first and second sub-modules 40-1 to 40-2. In certain embodiments, one or more bonding wire walls 28 are provided between the first and second sub-modules 40-1 to 40-2 as described for FIG. 6, and one or more additional bonding wire walls 28 are arranged about the one or more peripheral boundaries 62. As with previous embodiments, each of the bonding wire walls 28 may be formed by a plurality of the bonding wires 24. As illustrated, the bonding wire walls 28 arranged about the peripheral boundaries 62 may be electrically coupled to ground by portions of the first metal layer 52-1 of the substrate 12. In this manner, the electromagnetic shield 20 is arranged on the first sub-module 40-1 and the second sub-module 40-2, and the electromagnetic shield 20 is electrically coupled and grounded to the bonding wire walls 28 arranged between the sub-modules 40-1, 40-2 and along the peripheral boundaries 62. In certain embodiments, one or more additional openings 64 may be formed in the overmold body 18 along the peripheral boundaries 62 in a similar manner to the opening 48 that is formed between the sub-modules 40-1, 40-2. As such, portions of the electromagnetic shield 20 may also be configured to extend toward the substrate 12 along the peripheral boundaries 62. In other embodiments, the additional openings 64 may be omitted.

Figure 8A:
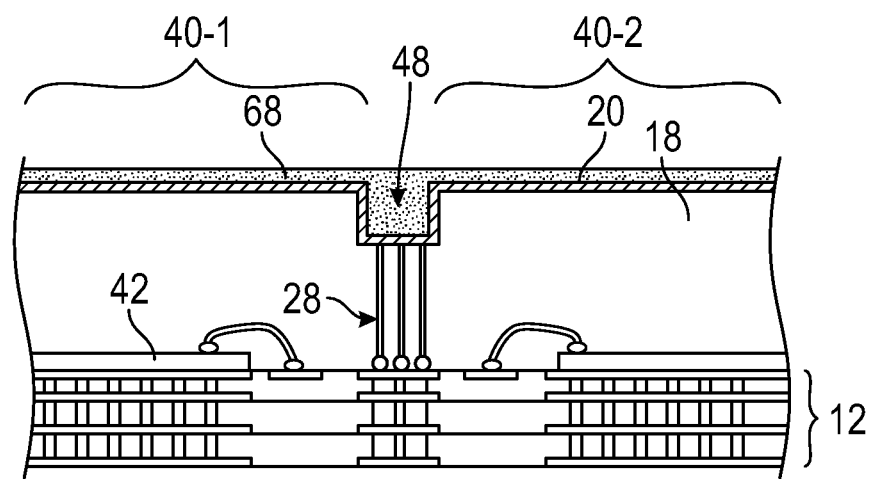
FIG. 8A and FIG. 8B are cross-sectional views of a module where a fill material is applied in an opening that is formed between sub-modules according to embodiments disclosed herein.
Figure 8B:
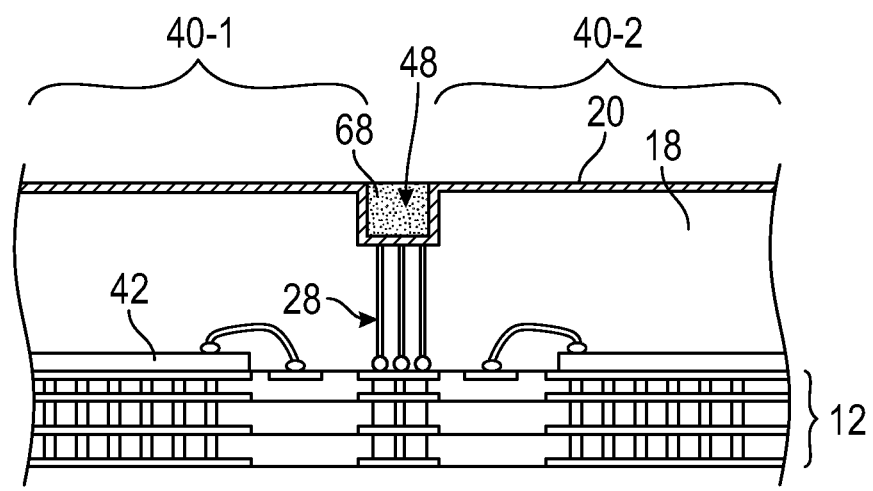

FIG. 8A and FIG. 8B are a cross-sectional views of a module 66 where a fill material 68 is applied in the opening 48 that is formed between the sub-modules 40-1, 40-2 according to embodiments disclosed herein. The module 60 includes the first sub-module 40-1 and the second sub-module 40-2 on the substrate 12, the electromagnetic shield 20, and one or more of the bonding wire walls 28 as previously described. Each of the sub-modules 40-1, 40-2 may include one or more of the electronic components 42 that are mounted to the substrate 12. In certain embodiments, the fill material 68 may be arranged in the opening 48 between each sub-module 40-1, 40-2 to provide structural support. In this manner, the fill material 68 may be arranged on the portion of the electromagnetic shield 20 that is in the opening 48. In certain embodiments, the fill material 68 is configured to partially, but not fully fill the opening 48 and in other embodiments, the fill material 68 may completely fill the opening 48. The fill material 68 may comprise one or more of an epoxy, a mold compound, and a thermoset material, among others. In certain embodiments, the fill material 68 comprises one or more insulating or dielectric materials. In certain embodiments, the fill material 68 may comprise the same material as the overmold body 18. The fill material 68 may be formed by dispensing, molding, transfer molding, or compression molding techniques, among others. In other embodiments, the fill material 68 may comprise a conductive material, such as conductive epoxy, or one or more metallized layers (not shown) formed by various plating or deposition techniques. As illustrated in FIG. 8A, the fill material 68 may also be arranged on or to cover portions of the electromagnetic shield 20 that are outside of the opening 48, thereby providing additional encapsulation. In other embodiments, the fill material 68 may only be arranged within the opening 48 as illustrated in FIG. 8B.

Figure 9:
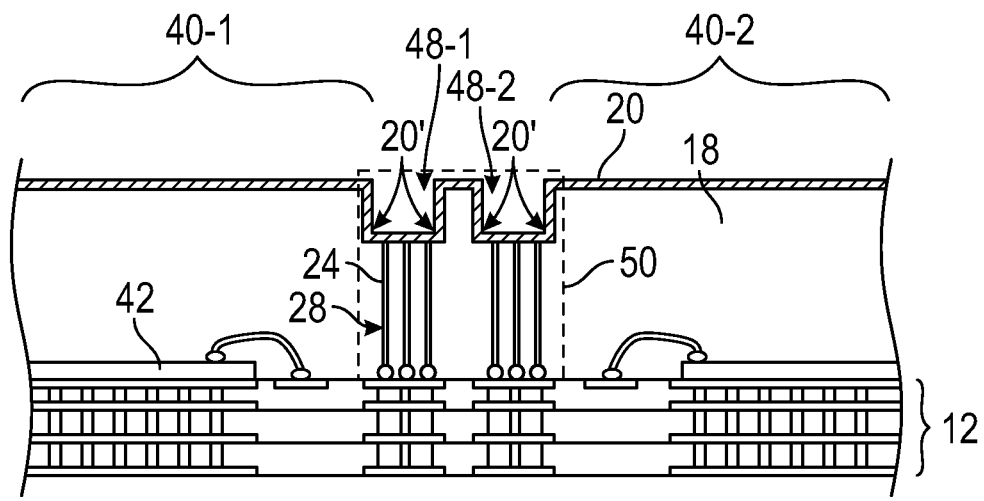
FIG. 9 is a cross-sectional view of a module that includes a plurality of the openings that are formed between sub-modules according to embodiments disclosed herein.

FIG. 9 is a cross-sectional view of a module 70 that includes a plurality of openings 48-1 to 48-2 that are formed between the sub-modules 40-1, 40-2 according to embodiments disclosed herein. The module 70 includes the first sub-module 40-1 and the second sub-module 40-2 on the substrate 12, the electromagnetic shield 20, and one or more of the bonding wire walls 28 formed of bonding wires 24 as previously described. Each of the sub-modules 40-1, 40-2 may include one or more of the electronic components 42 that are mounted to the substrate 12. As illustrated, the plurality of openings 48-1 to 48-2 are formed in the overmold body 18 and arranged between the sub-modules 40-1, 40-2. In this manner, the electromagnetic shield 20 is conformal to each of the plurality of openings 48-1 to 48-2, thereby forming a plurality of portions 20' that extend toward the substrate 12. In this manner, the divider wall 50 is arranged with increased surface area of the electromagnetic shield 20 for reducing EMI. As illustrated, the divider wall 50 may additionally include one or more of the bonding wire walls 28 that are registered with each of the openings 48-1 to 48-2. In certain embodiments, one or more of the openings 48-1 to 48-2 may include the fill material (68 of FIG. 8A) as previously described. While two openings 48-1 to 48-2 are illustrated in FIG. 9, any number of openings between the sub-modules 40-1, 40-2 may be provided without departing from the principles of the present disclosure.

Figure 10:
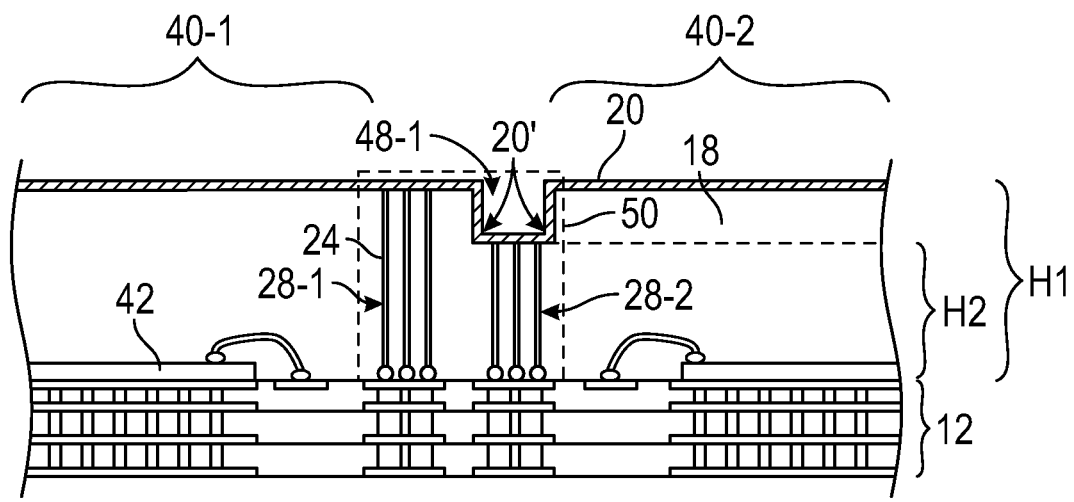
FIG. 10 is a cross-sectional view of a module that includes bond wire walls that have differing heights according to embodiments disclosed herein.

FIG. 10 is a cross-sectional view of a module 72 that includes a plurality of bonding wire walls 28-1 to 28-2 that have differing heights according to embodiments disclosed herein. The module 72 includes the first sub-module 40-1 and the second sub-module 40-2 on the substrate 12, the electromagnetic shield 20, and the plurality of the bonding wire walls 28-1 to 28-2 formed of bonding wires 24 as previously described. Each of the sub-modules 40-1, 40-2 may include one or more of the electronic components 42 that are mounted to the substrate 12. As illustrated, the divider wall 50 includes the bonding wire wall 28-1 that forms a first height H1 above the substrate 12 and the bonding wire wall 28-2 that forms a second height H2 above the substrate 12, wherein the second height H2 is less than or greater than the first height H1. In certain embodiments, the opening 48-1 in the overmold body 18 is only registered with the bonding wire wall 28-2, thereby forming the second height H2 as less than the first height H1. Other arrangements are possible without departing from the principles of the present disclosure. For example, the bonding wire walls 28-1, 28-2 of differing heights may be arranged at different locations of the module 72. In certain embodiments, bonding wire walls 28 arranged along one or more peripheral boundaries (e.g., 62 of FIG. 7) of the module 72 may form heights that are greater than or less than heights of the bonding wire walls 28 that are registered between the sub-modules 40-1, 40-2. In certain embodiments, the differing heights H1, H2 may be formed by sequential removal processes applied to the overmold body 18. For example, a first removal process may be applied to portions of the overmold body 18 over each of the sub-modules 40-1, 40-2 to expose at least a portion of the bonding wire wall 28-1. A second removal process may then be selectively applied to a portion of the overmold body 18 that is registered with the bonding wire wall 28-2, thereby exposing a portion of the bonding wire wall 28-2.

Figure 11:
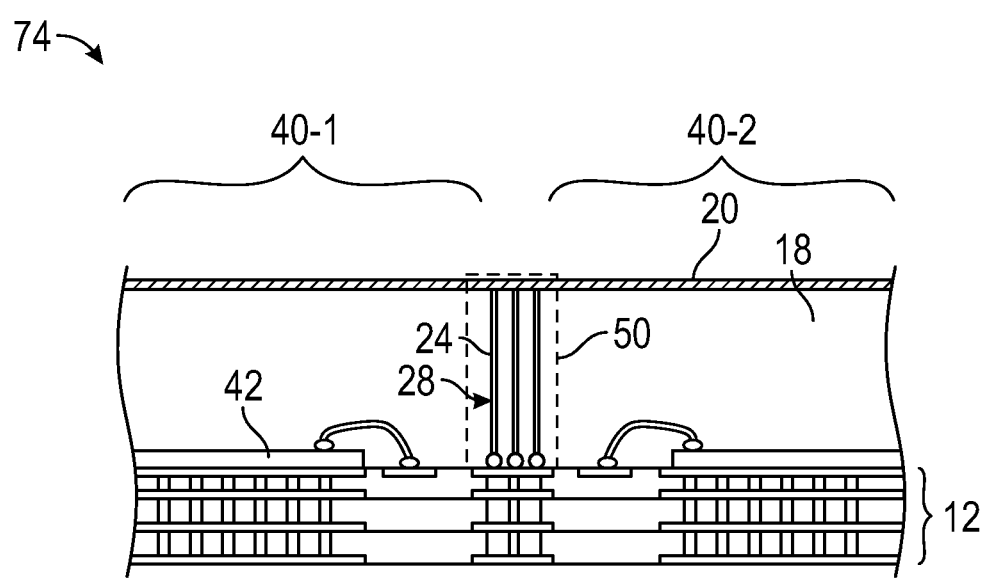
FIG. 11 is a cross-sectional view of a module that is devoid of openings in an overmold body between sub-modules according to embodiments disclosed herein.

FIG. 11 is a cross-sectional view of a module 74 that is devoid of openings in the overmold body 18 between the sub-modules 40-1, 40-2 according to embodiments disclosed herein. The module 74 includes the first sub-module 40-1 and the second sub-module 40-2 on the substrate 12, the electromagnetic shield 20, and one or more of the bonding wire walls 28 as previously described. Each of the sub-modules 40-1, 40-2 may include one or more of the electronic components 42 that are mounted to the substrate 12. As illustrated, the overmold body 18 is devoid of openings (48 of FIG. 7) that are arranged between the sub-modules 40-1, 40-2. In this manner, the removal process that exposes portions of the bond wires 24 of the bonding wire walls 28 may be applied across the module 74 such that portions of the overmold body 18 are removed across each of the sub-modules 40-1, 40-2. As illustrated, the divider wall 50 may include a plurality of the bonding wire walls 28 that are electrically coupled to the electromagnetic shield 20.

Those skilled in the art will recognize improvements and modifications to the preferred embodiments of the present disclosure. All such improvements and modifications are considered within the scope of the concepts disclosed herein and the claims that follow.

What is claimed is:

1. A method for forming an electronic module, the method comprising:
   providing a first sub-module and a second sub-module on a mounting surface of a substrate;
   forming a plurality of bonding wires on the substrate between the first sub-module and the second sub-module by bonding opposing ends of each bonding wire of the plurality of bonding wires to different portions of the substrate and forming bonding wire loops between each of the opposing ends;
   embedding the first sub-module, the second sub-module, and the plurality of bonding wires within an overmold body;
   removing a portion of the overmold body to form exposed surfaces of the plurality of bonding wires;
   forming a cavity in the overmold body around an exposed surface of a first bonding wire of the plurality of bonding wires, the cavity having a width that is greater than a width of the first bonding wire of the plurality of bonding wires; and
   depositing an electromagnetic shield on the overmold body, the electromagnetic shield being electrically coupled with the exposed surfaces of the plurality of bonding wires.

2. The method of claim 1 wherein said removing the portion of the overmold body to form exposed surfaces of the plurality of bonding wires further comprises removing portions of the bonding wire loops.

3. The method of claim 1, further comprising forming a plurality of cavities in the overmold body around each exposed surface of the plurality of bonding wires.

4. The method of claim 3, wherein each cavity of the plurality of cavities is formed by laser ablation, mechanical removal, ion milling, or chemical removal.

5. The method of claim 3, wherein the electromagnetic shield is deposited within each cavity of the plurality of cavities.

6. The method of claim 1, wherein the electromagnetic shield covers at least 90% of a surface of the overmold body.

7. The method of claim 6, wherein the surface of the overmold body comprises both a top surface and side surfaces of the overmold body.

8. The method of claim 1, wherein the plurality of bonding wires forms a bonding wire wall between the first sub-module and the second sub-module that reduces electromagnetic interference between the first sub-module and the second sub-module.

9. The method of claim 1, wherein:
   said removing the portion of the overmold body to form exposed surfaces of the plurality of bonding wires comprises forming an opening in the overmold body between the first sub-module and the second sub-module; and
   said depositing the electromagnetic shield comprises forming a portion of the electromagnetic shield within the opening such that the portion of the electromagnetic shield extends toward the substrate between the first sub-module and the second sub-module.

10. The method of claim 9, further comprising applying a fill material on the electromagnetic shield such that the electromagnetic shield is between the fill material and the overmold body within the opening.

11. The method of claim 1, wherein the electromagnetic shield is electrically coupled to ground by way of the plurality of bonding wires.

12. The method of claim 1, wherein at least one of the first sub-module and the second sub-module comprises a radio frequency circuit or a micro-mechanical system.

13. A method for forming an electronic module, the method comprising:
   providing a plurality of sub-modules on a mounting surface of a substrate;
   bonding a plurality of bonding wires to the substrate such that each bonding wire of the plurality of bonding wires has a first end bonded to a first portion of the substrate and a second end bonded to a second portion of the substrate that is different from the first portion;
   embedding the plurality of sub-modules and the plurality of bonding wires within an overmold body;
   removing a portion of the overmold body and a portion of the plurality of bonding wires;
   forming a cavity in the overmold body around an exposed surface of a first bonding wire of the plurality of bonding wires, the cavity having a width that is greater than a width of the first bonding wire of the plurality of bonding wires; and depositing an electromagnetic shield on the overmold body, the electromagnetic shield being electrically coupled with the plurality of bonding wires.

14. The method of claim 13, wherein:

a bonding wire loop is formed between the first end and the second end of each bonding wire of the plurality of bonding wires; and said removing the portion of the plurality of bonding wires comprises removing portions of each bonding wire loop.

15. The method of claim 13, wherein:

the plurality of sub-modules comprises a first sub-module and a second sub-module; and the plurality of bonding wires comprises a first bonding wire wall between the first sub-module and the second sub-module.

16. The method of claim 15, wherein:

the plurality of sub-modules further comprises a third sub-module; and the plurality of bonding wires further comprises a second bonding wire wall between the second sub-module and the third sub-module.

17. The method of claim 16, wherein the electromagnetic shield is electrically coupled to ground by way of the first bonding wire wall and the second bonding wire wall.

18. The method of claim 13, further comprising forming a plurality of cavities in the overmold body around each bonding wire of the plurality of bonding wires after said removing the portion of the overmold body and the portion of the plurality of bonding wires.

19. The method of claim 18, wherein the electromagnetic shield is deposited within each cavity of the plurality of cavities.

20. The method of claim 13, wherein the plurality of sub-modules comprises a radio frequency circuit or a micromechanical system.

\* \* \* \* \*